(12) United States Patent
Leobandung et al.

(10) Patent No.: US 10,079,249 B2
(45) Date of Patent: Sep. 18, 2018

(54) FINFET DEVICES WITH MULTIPLE CHANNEL LENGTHS

(71) Applicant: International Business Machines Corporation, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/259,096

(22) Filed: Sep. 8, 2016

(65) Prior Publication Data

US 2016/0379890 A1  Dec. 29, 2016

Related U.S. Application Data

(62) Division of application No. 14/676,850, filed on Apr. 2, 2015, now Pat. No. 9,496,399.

(51) Int. Cl.
| | |
|---|---|
| *H01L 21/8234* | (2006.01) |
| *H01L 27/12* | (2006.01) |
| *H01L 29/78* | (2006.01) |
| *H01L 29/66* | (2006.01) |
| *H01L 29/10* | (2006.01) |
| *H01L 21/033* | (2006.01) |
| *H01L 27/02* | (2006.01) |

(Continued)

(52) U.S. Cl.
CPC ...... *H01L 27/1211* (2013.01); *H01L 21/0337* (2013.01); *H01L 21/823412* (2013.01); *H01L 21/823431* (2013.01); *H01L 21/823456* (2013.01); *H01L 21/823462* (2013.01); *H01L 21/845* (2013.01); *H01L 27/0207* (2013.01); *H01L 27/0886* (2013.01); *H01L 29/1033* (2013.01); *H01L 29/6656* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,271,063 B1 * | 8/2001 | Chan | H01L 27/11 257/393 |
| 6,794,718 B2 * | 9/2004 | Nowak | H01L 21/823807 257/347 |

(Continued)

OTHER PUBLICATIONS

IBM: List of IBM Patents or Patent Applications Treated as Related (Appendix P), Oct. 4, 2016, 2 pages.

(Continued)

*Primary Examiner* — Michael Lebentritt
*Assistant Examiner* — Jordan Klein
(74) *Attorney, Agent, or Firm* — L. Jeffrey Kelly

(57) ABSTRACT

A method including patterning a continuous fin having a first segment and a second segment in a semiconductor layer, the first segment is arranged at an angle relative to the second segment, and forming a first gate and a second gate substantially parallel to each other, the first gate substantially covering sides and a top of a portion of the first segment of the continuous fin, the second gate substantially covering sides and a top of a portion of the second segment of the continuous fin.

19 Claims, 28 Drawing Sheets

(51) Int. Cl.
*H01L 21/84* (2006.01)
*H01L 27/088* (2006.01)

(56) References Cited

U.S. PATENT DOCUMENTS

| | | | | |
|---|---|---|---|---|
| 6,867,460 | B1 * | 3/2005 | Anderson | H01L 21/845 257/351 |
| 6,967,351 | B2 * | 11/2005 | Fried | H01L 21/84 257/255 |
| 7,183,142 | B2 | 2/2007 | Anderson et al. | |
| 7,323,374 | B2 | 1/2008 | Beintner et al. | |
| 7,414,877 | B2 * | 8/2008 | Burnett | G11C 11/412 365/154 |
| 7,816,198 | B2 * | 10/2010 | Ostermayr | H01L 21/823807 257/369 |
| 7,847,320 | B2 | 12/2010 | Anderson et al. | |
| 7,871,876 | B2 * | 1/2011 | Anderson | H01L 21/823807 257/351 |
| 7,906,802 | B2 * | 3/2011 | Baumgartner | H01L 21/823431 257/255 |
| 8,987,831 | B2 * | 3/2015 | Liaw | G11C 11/412 257/368 |
| 2006/0154426 | A1 * | 7/2006 | Anderson | H01L 29/42384 438/300 |
| 2007/0045736 | A1 * | 3/2007 | Yagishita | H01L 27/1203 257/347 |
| 2007/0063276 | A1 * | 3/2007 | Beintner | H01L 21/845 257/347 |
| 2007/0171700 | A1 * | 7/2007 | Burnett | G11C 11/412 365/154 |
| 2008/0054306 | A1 * | 3/2008 | Gopalakrishnan | H01L 27/228 257/202 |
| 2008/0121948 | A1 | 5/2008 | Kim et al. | |
| 2008/0308880 | A1 | 12/2008 | Inaba | |
| 2009/0001470 | A1 * | 1/2009 | Anderson | H01L 21/845 257/351 |
| 2009/0026543 | A1 * | 1/2009 | Yang | H01L 21/845 257/365 |
| 2009/0121291 | A1 * | 5/2009 | Anderson | H01L 27/0207 257/365 |
| 2009/0197382 | A1 * | 8/2009 | Anderson | H01L 21/26513 438/283 |
| 2013/0181297 | A1 * | 7/2013 | Liaw | G11C 11/412 257/390 |

OTHER PUBLICATIONS

Pending U.S. Appl. No. 15/267,193, filed Sep. 16, 2016, entitled: "FinFET Devices With Multiple Channel Lengths", 50 pages.

Yamashita et al., "Opportunities and challenges of FinFET as a device structure candidate for 14nm node CMOS Technology" ECS Transactions, vol. 34, No. 1, pp. 81-86, 2011, The Electrochemical Society.

Pending U.S. Appl. No. 14/676,850, filed Apr. 2, 2015, entitled: "FinFET Devices With Multiple Channel Lengths", 51 pages.

* cited by examiner

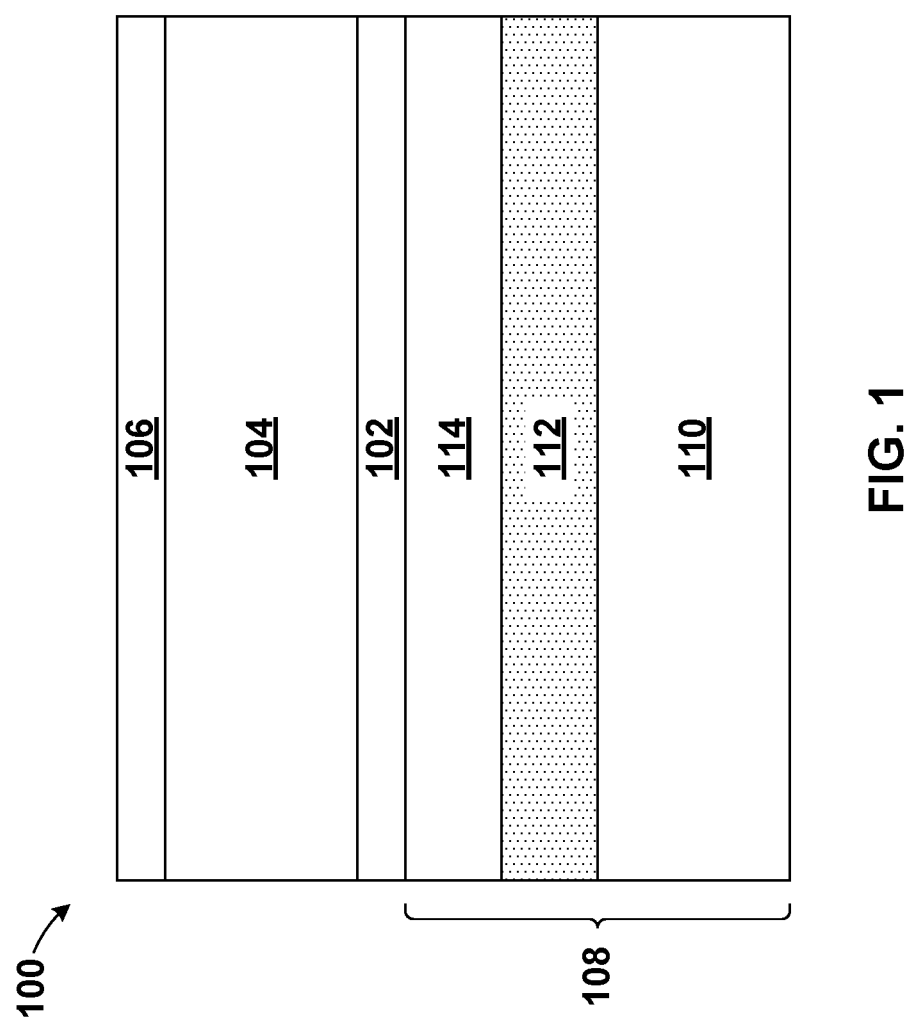

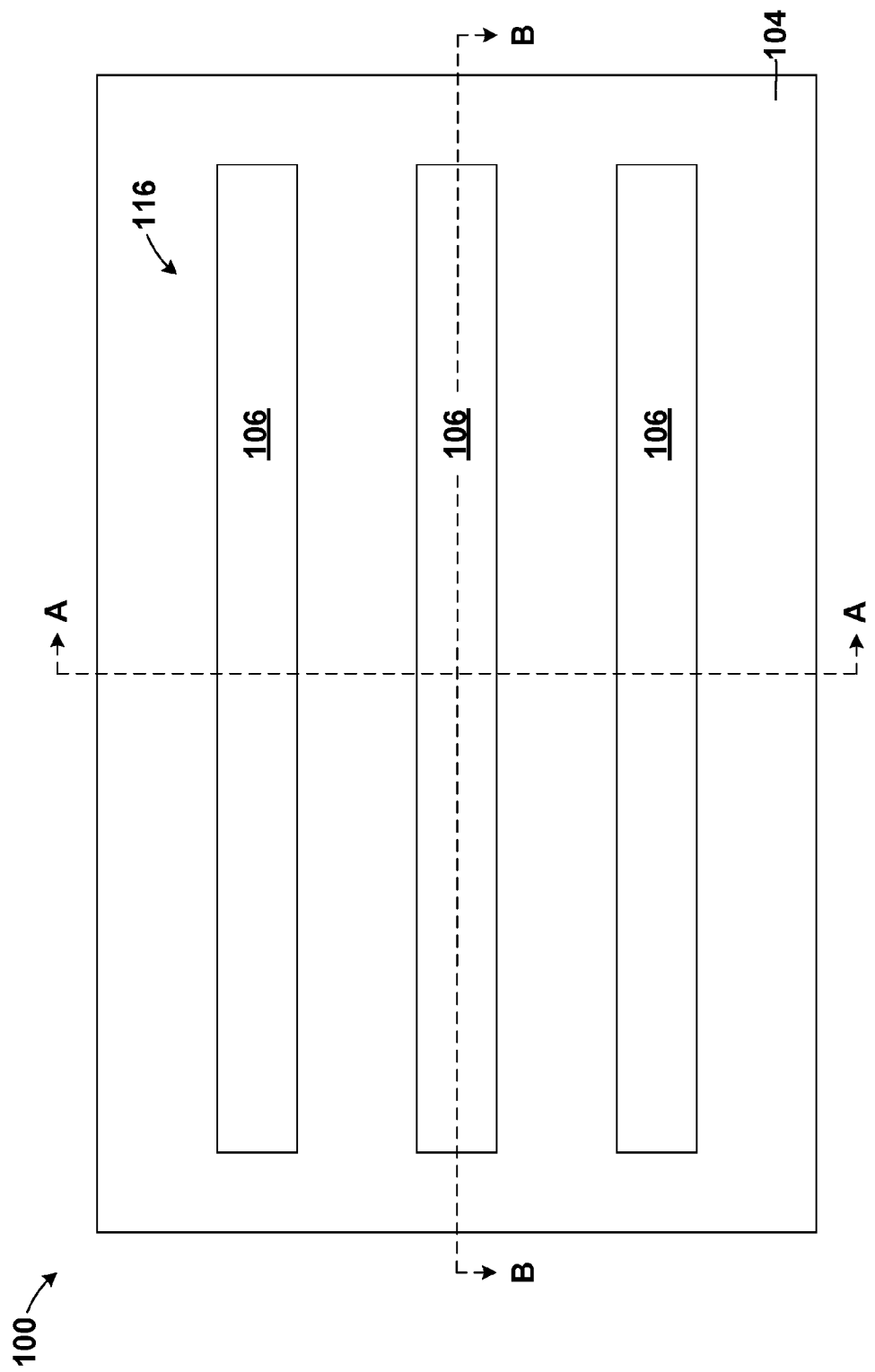

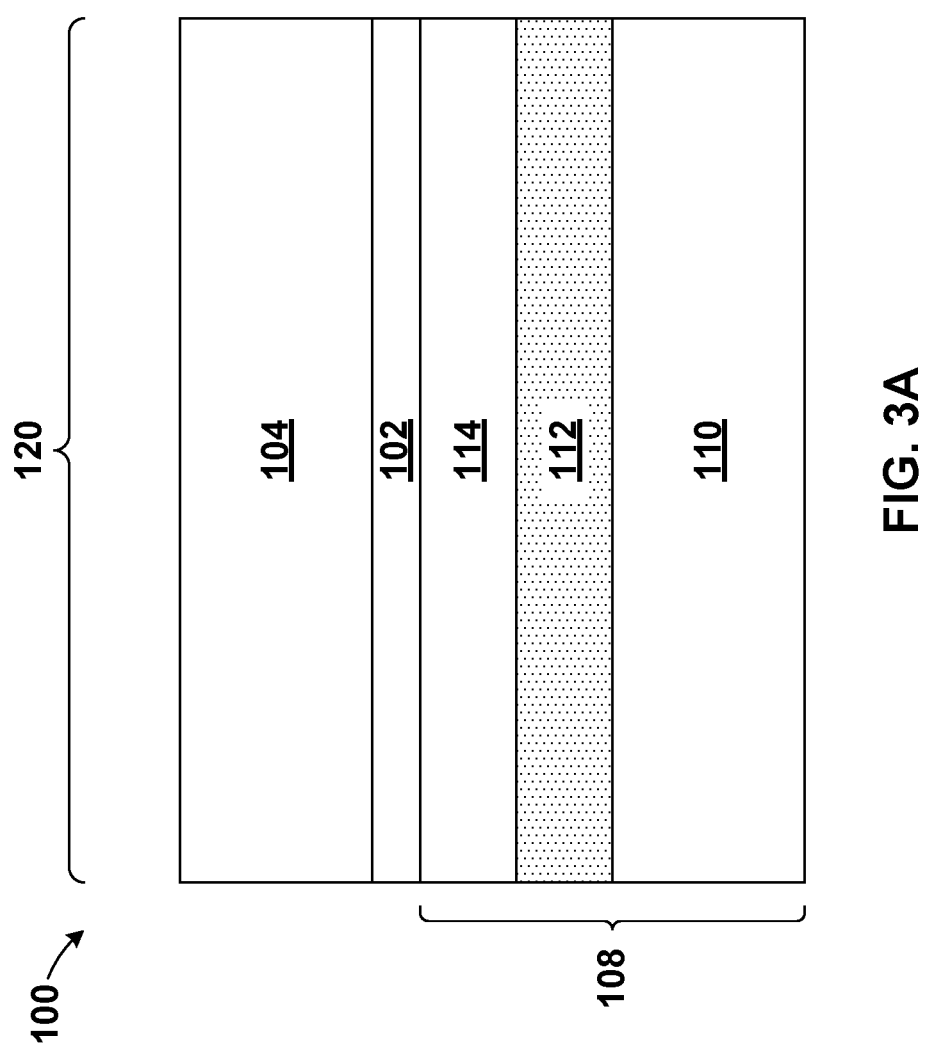

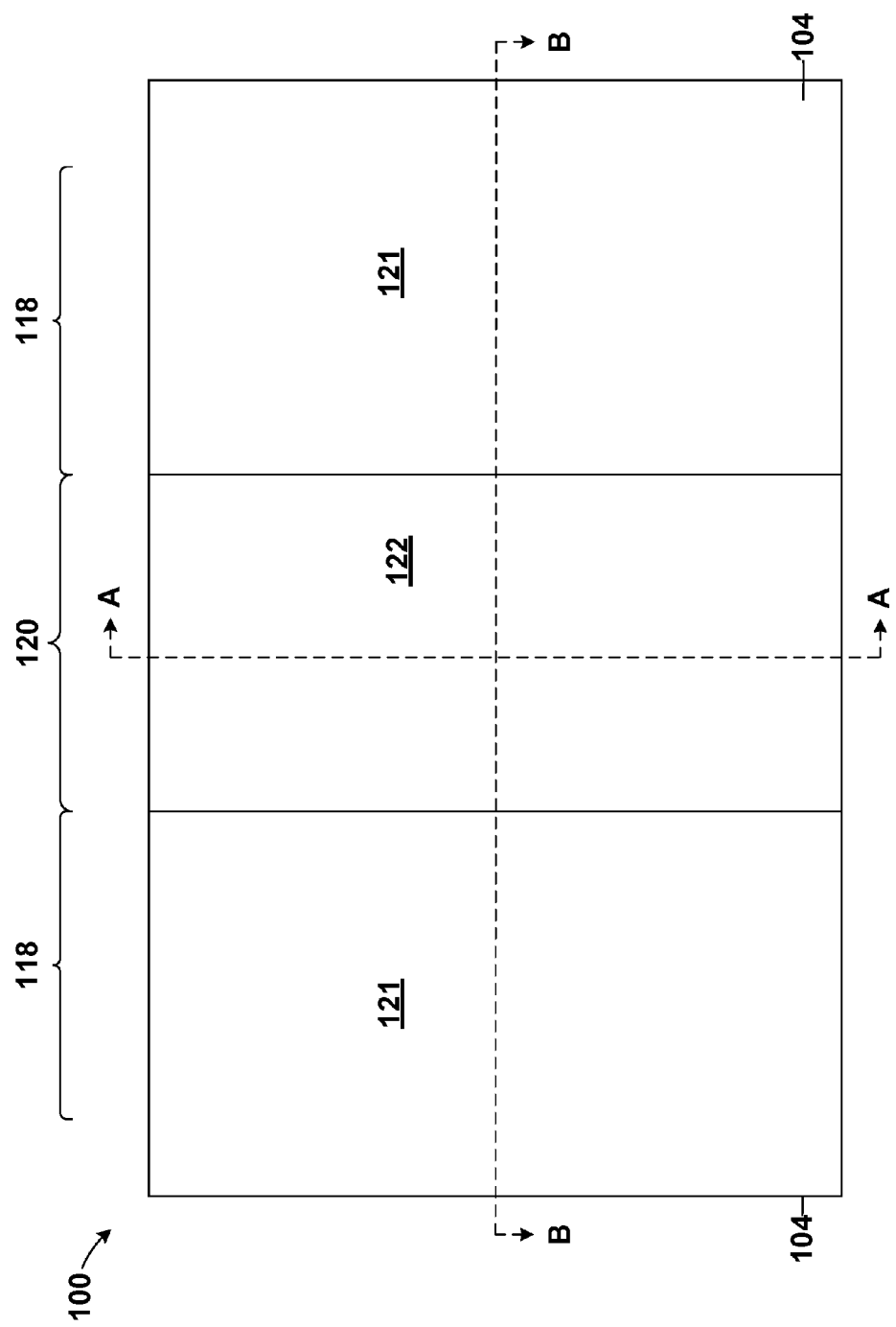

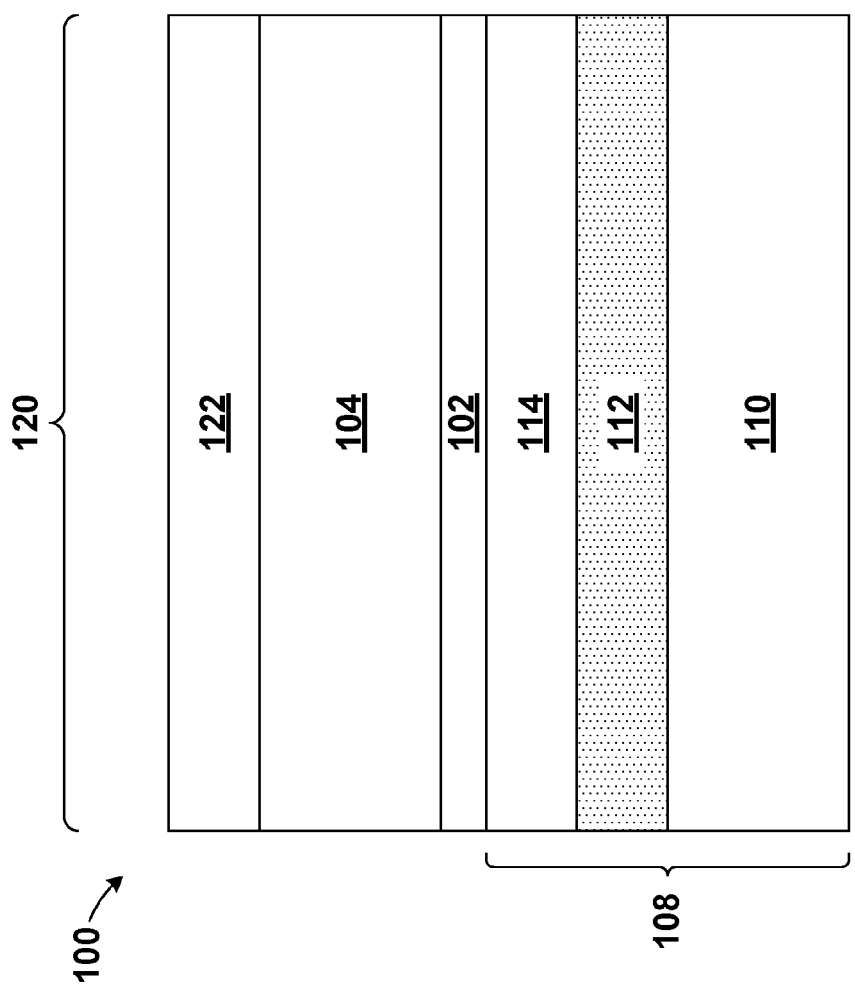

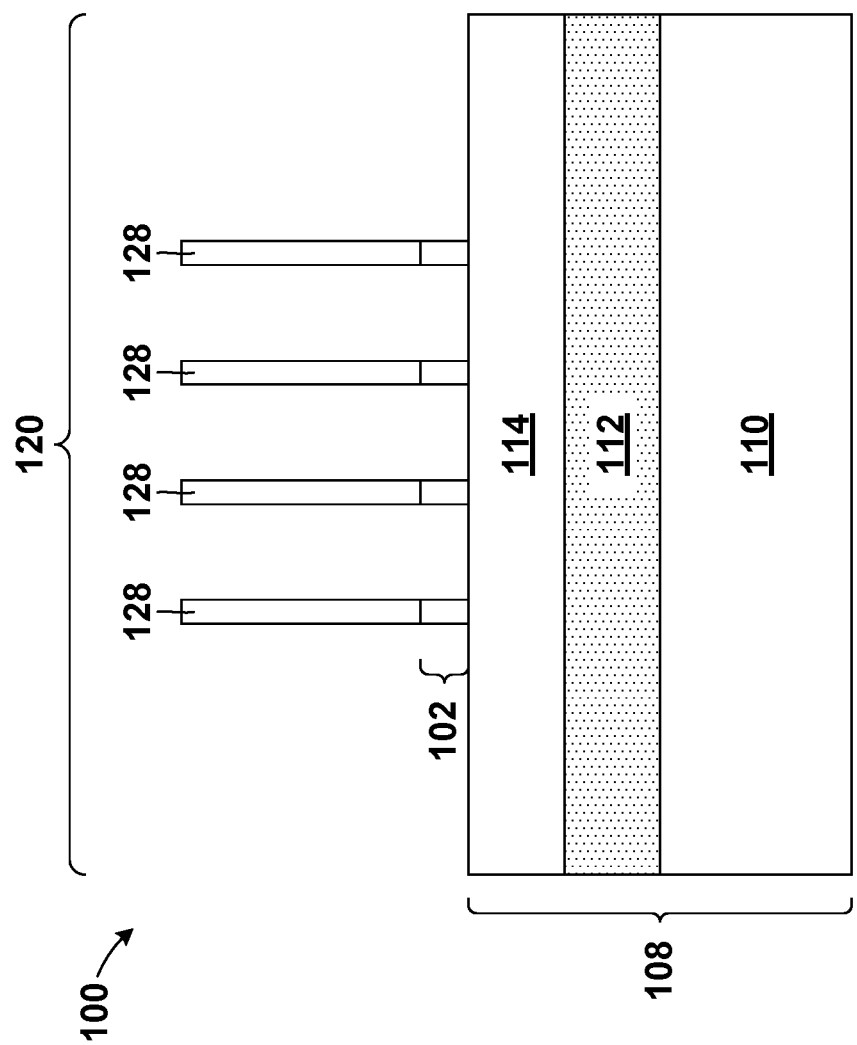

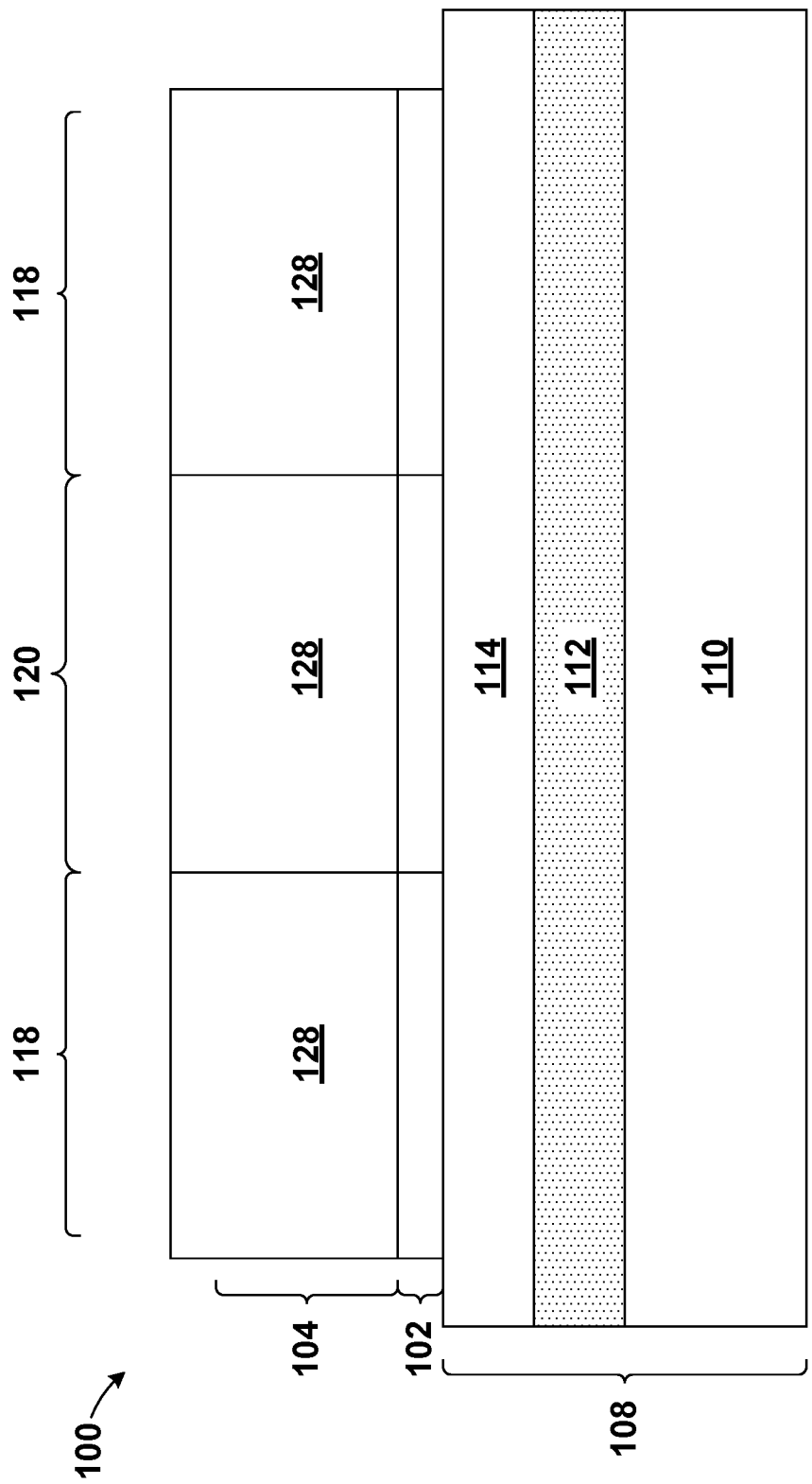

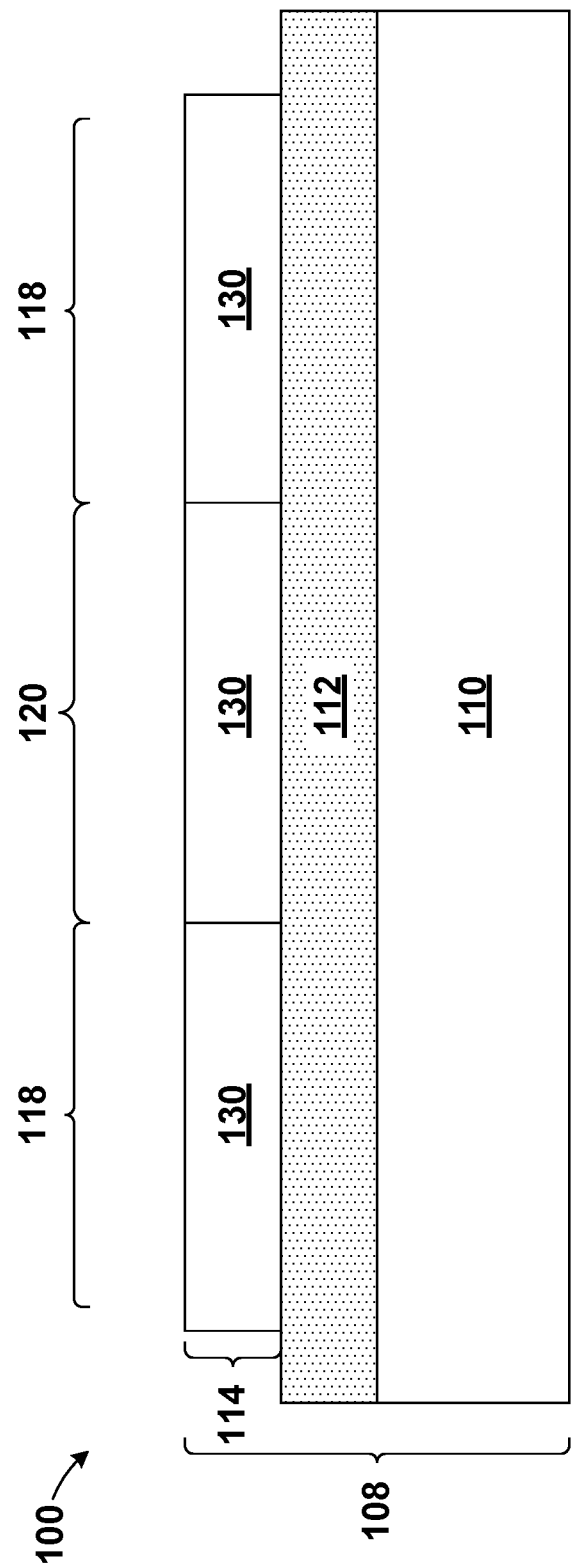

FINFET DEVICES WITH MULTIPLE CHANNEL LENGTHS

BACKGROUND

The present invention generally relates to semiconductor device manufacturing, and more particularly to fabricating finFET devices with multiple channel lengths.

A fin-type field effect transistor "FinFET" is a type of transistor that has a fin covered by a gate conductor. The gate conductor covers the channel portion of the fin and source and drain portions of the fin extend beyond the coverage of the gate conductor. As Very Large Scale Integration (VLSI) drives the reduction of the size of transistors to smaller dimensions, the power supply voltage is no longer able to be reduced in proportion due to non-scaling threshold voltages of transistors. This limits the amount of size reduction that can be accomplished on the gate length of FETs, and FinFETs.

SUMMARY

According to one embodiment of the present invention, a method is provided. The method may include forming a first pattern in a first hardmask layer above a mandrel layer, the first pattern including a set of parallel lines, forming a second pattern in a fill layer above the mandrel layer, the second pattern including a second set of parallel lines, at least one end of one of the parallel lines of the first pattern is in direct contact with at least one end of one of the parallel lines of the second pattern, and forming a mandrel by transferring the first and second patterns from the first layer into the mandrel layer is directly above a second hardmask layer. The method may further include forming a set of sidewall spacers above the second hardmask layer along opposite sidewalls of the mandrel, the second hardmask layer being on top of a substrate, removing the mandrel selective to the set of sidewall spacers and the second hardmask layer, forming a continuous fin by transferring a fin pattern defined by the set of sidewall spacers into the substrate, the continuous fin having a first segment and a second segment in the substrate, the first segment is arranged at an angle relative to the second line segment, and forming a first gate and a second gate substantially parallel to each other, the first gate substantially covering sides and a top of a portion of the first segment of the continuous fin, the second gate substantially covering sides and a top of a portion of the second segment of the continuous fin.

According to one embodiment of the present invention, a method is provided. The method may include patterning a continuous fin having a first segment and a second segment in a semiconductor layer, the first segment is arranged at an angle relative to the second line segment, and forming a first gate and a second gate substantially parallel to each other, the first gate substantially covering sides and a top of a portion of the first segment of the continuous fin, the second gate substantially covering sides and a top of a portion of the second segment of the continuous fin.

According to one embodiment of the present invention, a structure is provided. The structure may include a continuous fin having a first segment and a second segment in a semiconductor layer, the first segment is arranged at an angle relative to the second line segment, and a first gate and a second gate substantially parallel to each other, the first gate substantially covering sides and a top of a portion of the first segment of the continuous fin, the second gate substantially covering sides and a top of a portion of the second segment of the continuous fin.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 is a cross-sectional view of a structure at an intermediate step of fabrication according to an exemplary embodiment.

FIG. 2 is a top view of the structure and illustrates forming a first pattern in a first hardmask layer according to an exemplary embodiment.

FIG. 3A is a cross section view of FIG. 3, taken along section line A-A.

FIG. 4 is a top view of the structure and illustrates depositing a fill material according to an exemplary embodiment.

FIG. 4A is a cross section view of FIG. 4, taken along section line A-A.

FIG. 8A is a cross section view of FIG. 8, taken along section line A-A.

FIG. 8B is a cross section view of FIG. 8, taken along section line B-B.

FIG. 9B is a cross section view of FIG. 9, taken along section line B-B.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2A:
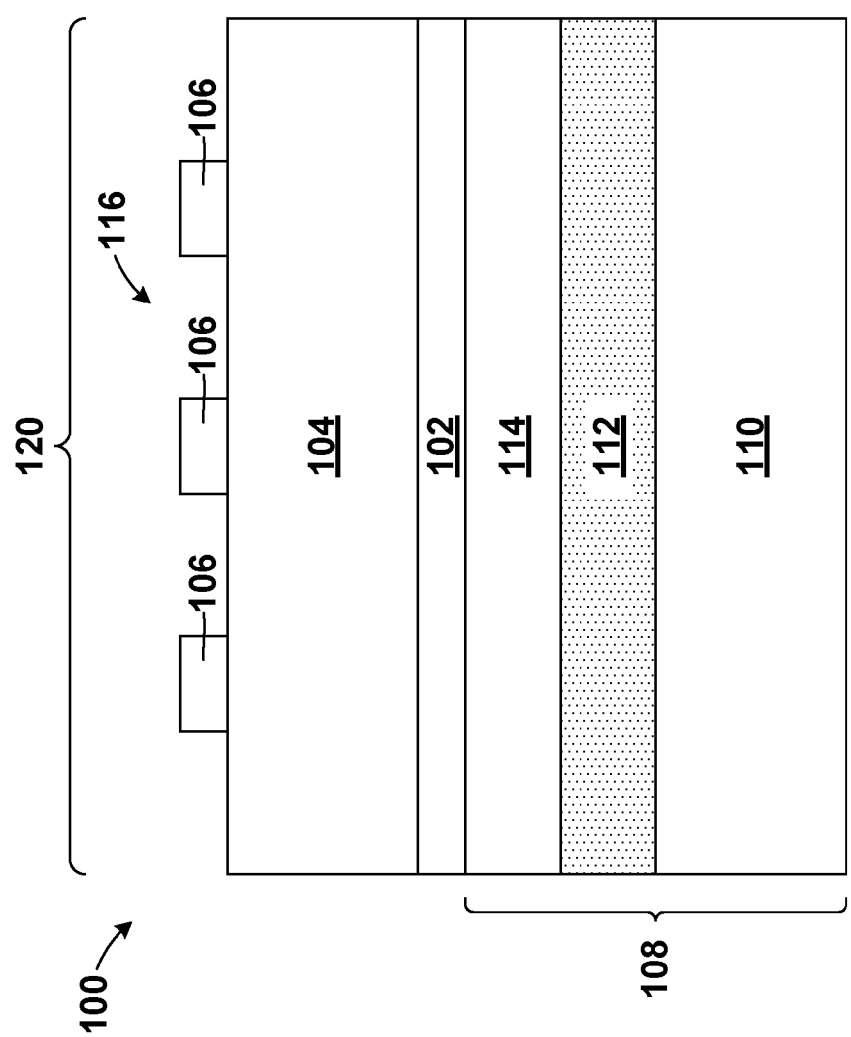
FIG. 2A is a cross section view of FIG. 2, taken along section line A-A.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In general, the invention described below allows for further customization and scaling of finFET devices, by increasing the effective gate length of some finFETS in an array of transistors without increasing the effective gate length of other finFETS in the transistor array, and without increasing the overall size of the transistor array.

The present invention generally relates to semiconductor device manufacturing, and more particularly to fabricating finFET devices with multiple channel lengths. Ideally, it may be preferable to fabricate an array of finFET devices with different channel lengths to achieve specific device performance characteristics and conserve area. One way to fabricate one or more finFET devices with multiple channel lengths may include patterning a continuous fin having multiple segments in which at least one of the segments is presented at an angle relative to the other segments. One embodiment by which to fabricate the continuous fin having at least one angled segment is described in detail below by referring to the accompanying drawings FIGS. 1-10.

Referring now to FIG. 1 a demonstrative illustration of a structure during an intermediate step of a method of fabricating finFET devices with multiple channel lengths is shown according to one embodiment. More specifically, the method can start with providing a structure 100 including a second hardmask layer 102, a mandrel layer 104, and a first hardmask layer 106 all above a substrate 108. FIG. 1 illustrates a cross section view of the structure 100.

The substrate 108 may include a bulk semiconductor or a layered semiconductor such as Si/SiGe, a silicon-on-insulator, or a SiGe-on-insulator. Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A semiconductor-on-insulator (SOI) substrate is illustrated in the figures and is relied upon for the corresponding discussion. The SOI substrate 108 of the present example includes a base substrate 110, a buried insulator layer 112, and a top semiconductor layer 114.

The base substrate 110 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 110 may be about, but is not limited to, several hundred microns thick. For example, the base substrate 110 may include a thickness ranging from 0.5 mm to about 1.5 mm, and ranges there between.

The buried insulator layer 112 may be formed from any of several dielectric materials. Non-limiting examples include, for example, oxides, nitrides and oxynitrides of silicon. Oxides, nitrides and oxynitrides of other elements are also envisioned. In addition, the buried insulator layer 108 may include crystalline or non-crystalline dielectric material. Moreover, the buried insulator layer 112 may be formed using any of several methods. Non-limiting examples include ion implantation methods, thermal or plasma oxidation or nitridation methods, chemical vapor deposition methods and physical vapor deposition methods. In one embodiment, the buried insulator layer 112 may be about 200 nm thick. Alternatively, the buried insulator layer 112 may include a thickness ranging from about 10 nm to about 500 nm, and ranges there between.

The top semiconductor layer 114 may include any of the several semiconductor materials included in the base substrate 110. In general, the base substrate 110 and the top semiconductor layer 114 may include either identical or different semiconducting materials with respect to chemical composition, dopant concentration and crystallographic orientation. In one particular embodiment of the present invention, the base substrate 110 and the top semiconductor layer 114 include semiconducting materials that include at least different crystallographic orientations. Typically the base substrate 110 or the top semiconductor layer 114 include a {110} crystallographic orientation and the other of the base substrate 110 or the top semiconductor layer 114 includes a {100} crystallographic orientation. Typically, the top semiconductor layer 114 includes a thickness ranging from about 5 nm to about 100 nm, and ranges there between. Methods for making the top semiconductor layer 114 are well known in the art. Non-limiting examples include SIMOX (Separation by Implantation of Oxygen), wafer bonding, and ELTRAN® (Epitaxial Layer TRANsfer). While the current embodiment describes the use of a SOI wafer, a bulk wafer can also be used where buried insulator layer 112 is not present.

The second hardmask layer 102 may be deposited on top of the substrate 108. The second hardmask layer 102 may include any dielectric material suitable for use as a hardmask, such as, for example, a nitride. In an embodiment, the second hardmask layer 102 may include silicon nitride, which may be formed using conventional deposition methods, for example, chemical vapor deposition, atomic layer deposition, physical vapor deposition, sputtering, or other like deposition techniques. The second hardmask 102 may be sufficiently thick to properly function as a mask during subsequent patterning steps. In an embodiment, the second hardmask 102 may have a thickness ranging from about 5 nm to about 50 nm, and ranges there between. The first hardmask 106, on top of the mandrel layer 104, is substantially similar in all respects to the second hardmask layer 102.

The mandrel layer 104 can be formed on top of the second hardmask layer 102. The mandrel layer 104 can include amorphous silicon or any silicon based compound, for example, silicon nitride, silicon oxide, or silicon carbon, or alternatively amorphous carbon. The mandrel layer 104 may preferably include a material that is different enough from the material of the sidewall spacers (described below) and the material of the second hardmask layer 102 so that it can be selectively removed. The particular material chosen can partly depend upon the desired pattern to be formed and the materials chosen in subsequent steps discussed below. The mandrel layer 104 may be formed using conventional deposition methods, for example, chemical vapor deposition, atomic layer deposition, physical vapor deposition, sputtering, or other like deposition techniques. The mandrel layer 104 may be sufficiently thick to properly function as a mask during subsequent patterning steps. In one embodiment, the mandrel layer 104 can be formed with a vertical thickness ranging from about 10 nm to about 100 nm, and ranges there between.

Figure 2B:
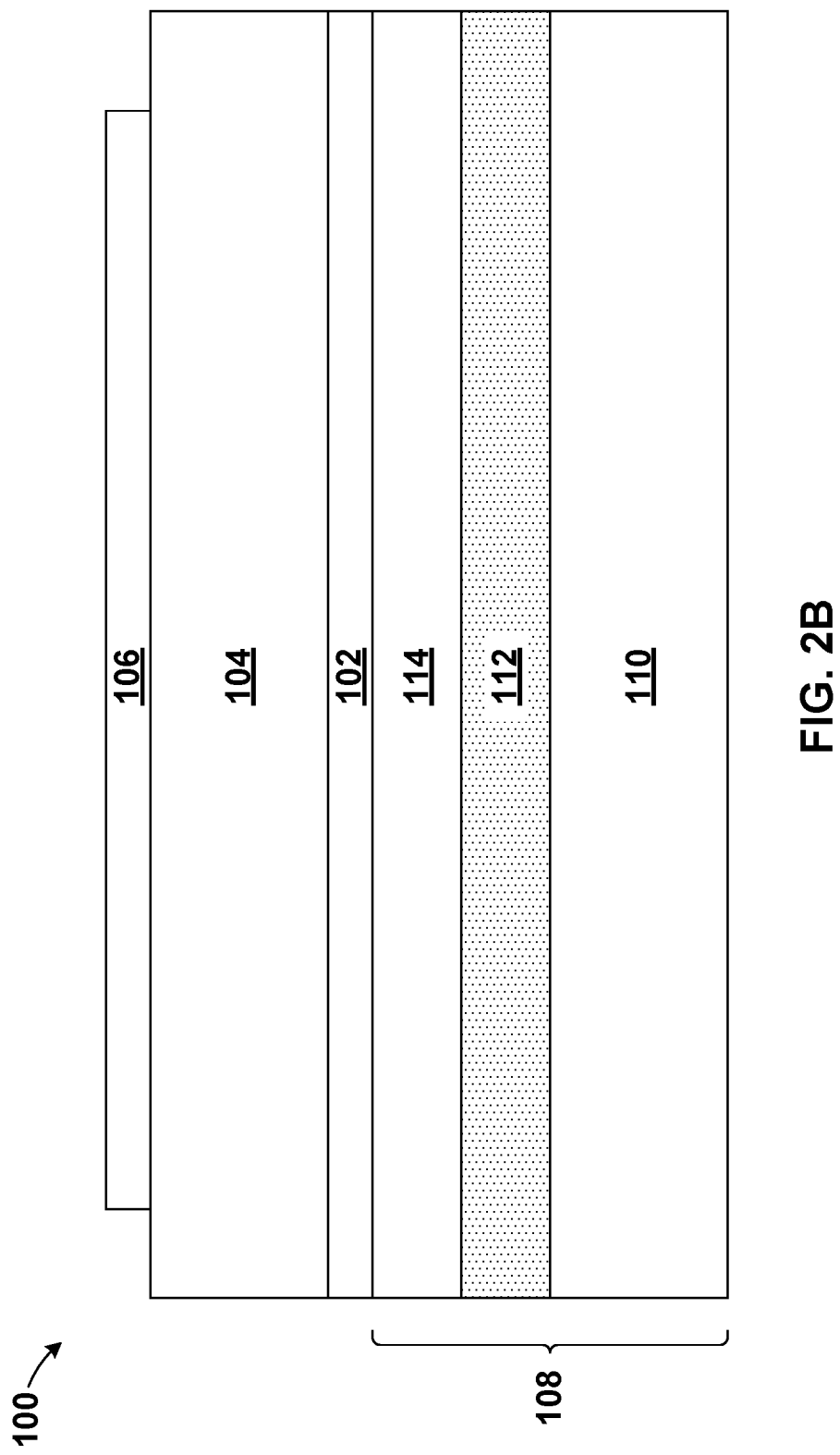
FIG. 2B is a cross section view of FIG. 2, taken along section line B-B.

Referring now to FIGS. 2 and 2A a demonstrative illustration of a structure during an intermediate step of the method of fabricating finFET devices with multiple channel lengths is shown according to one embodiment. More specifically, the method include with forming a first pattern 116 in the first hardmask layer 106. FIG. 2 illustrates a cross section view of the structure 100. FIG. 2A is a cross section view of FIG. 2 taken along section line A-A. FIG. 2B is a cross section view of FIG. 2 taken along section line B-B.

After depositing the first hardmask layer 106, it may be etched to form the first pattern 116 according to lithographic patterning and etching techniques known in the art. The first pattern 116 may include a set of parallel lines or "fins," etched from the first hardmask 106. As illustrated in the figures the first pattern 116 includes three parallel lines; however, it may include any number of parallel lines. The parallel lines of the first pattern 116 may be any length, any width, and have any spacing to produce the final finFET array.

In an embodiment, the width or spacing of the parallel lines of the first pattern 116 may be sublithographic, or smaller than a lithographic minimum dimension. The term "sublithographic" may refer to a dimension or size less than current dimensions achievable by photolithographic processes, and the term "lithographic" or "lithographic minimum dimension" may refer to a dimension or size equal to or greater than current dimensions achievable by photolithographic processes. The sublithographic and lithographic dimensions may be determined by a person of ordinary skill in the art at the time the application is filed. While a "lithographic minimum dimension" and a "sublithographic dimension" are defined only in relation to a lithography tool and normally change from generation to generation of semiconductor technology, it is understood that the lithographic minimum dimension and the sublithographic dimension are to be defined in relation to the best performance of lithography tools available at the time of semiconductor manufacturing. As of 2015, the lithographic minimum dimension is about 20 nm and is expected to shrink in the future.

Figure 3:
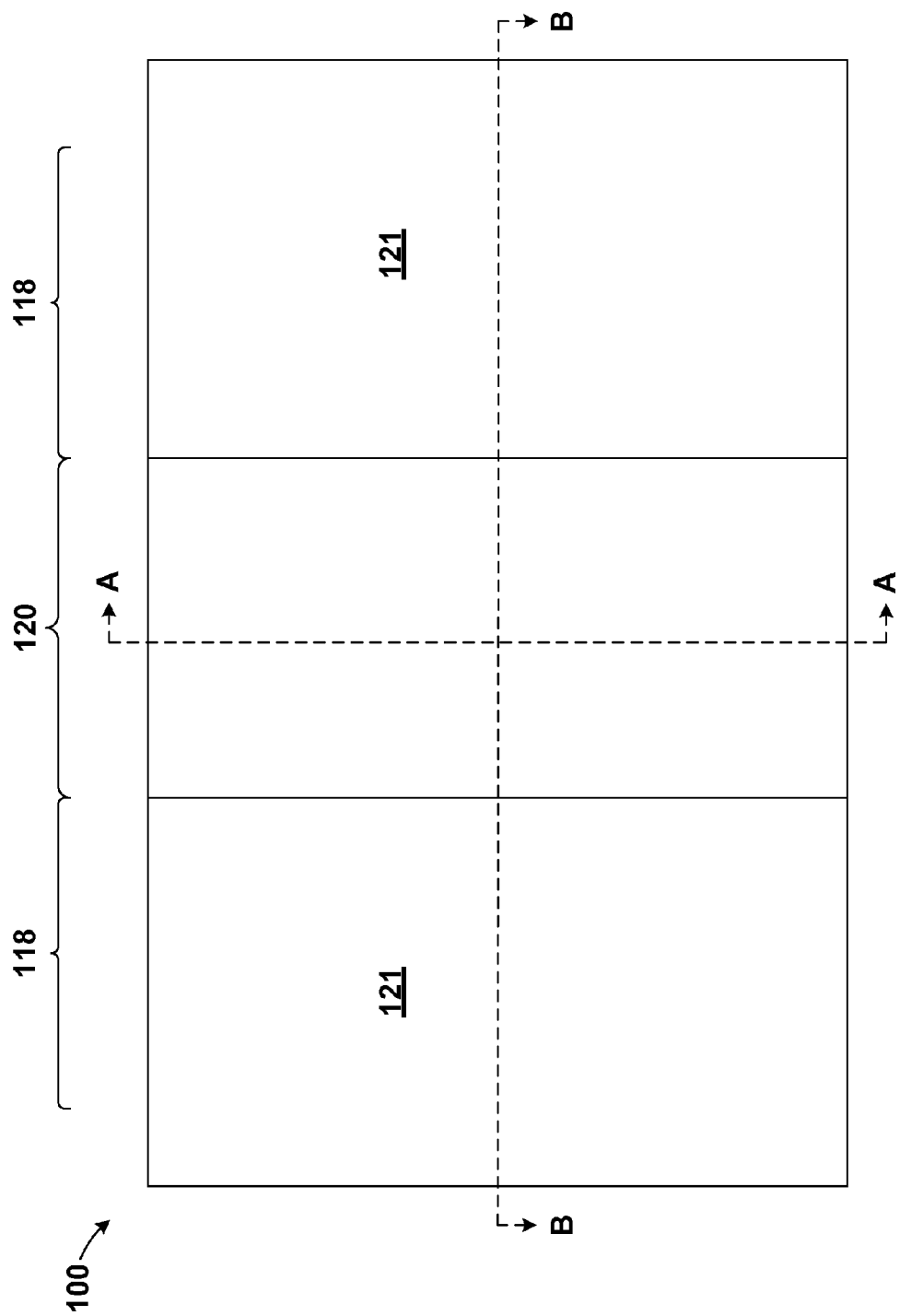
FIG. 3 is a top view of the structure and illustrates removing a portion of the a first pattern in a first hardmask layer according to an exemplary embodiment.
Figure 3B:
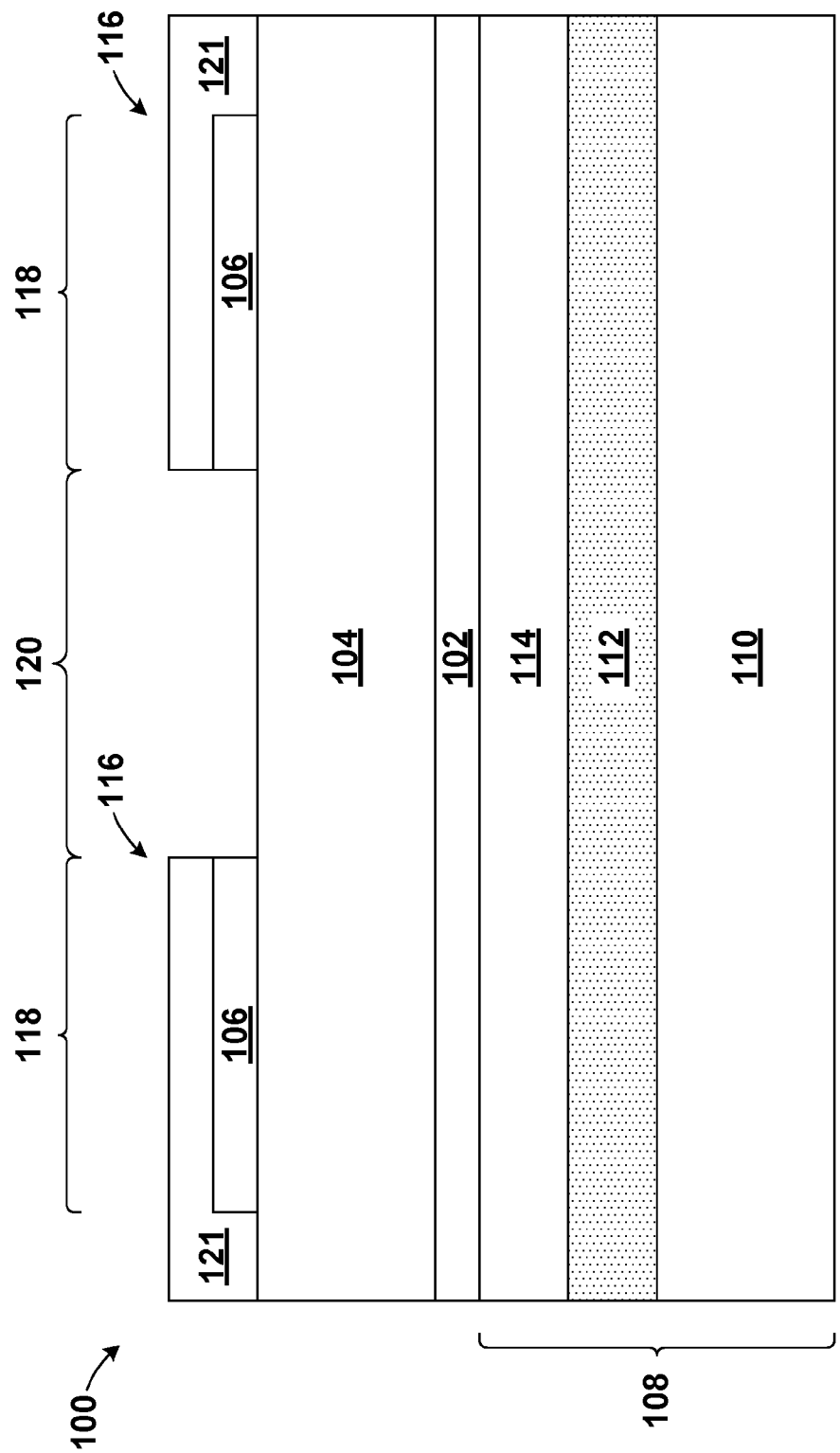
FIG. 3B is a cross section view of FIG. 3, taken along section line B-B.

Referring now to FIGS. 3 and 3A a demonstrative illustration of a structure during an intermediate step of the method of fabricating finFET devices with multiple channel lengths is shown according to one embodiment. More specifically, the method can include removing a portion of the first pattern 116. FIG. 3 illustrates a cross section view of the structure 100. FIG. 3A is a cross section view of FIG. 3 taken along section line A-A. FIG. 3B is a cross section view of FIG. 3 taken along section line B-B.

The structure 100 may include a first region 118 and a second region 120. In the present step, a portion of the first pattern 116 may be removed from the second region 120 according to lithographic patterning and etching techniques known in the art. First a photoresist or mask 121 may be deposited and patterned to protect a portion of the first pattern 116 in the first region 118 while another portion of the first pattern 116 is removed from the second region 120. The first pattern 116 may remain in the first region 118. In the example illustrated in the figures, two first regions 118 may be separated by a single second region 120. As such, a middle portion of the first pattern 116 may be removed. The portion of the first pattern 116 may preferably be removed selective to the mandrel layer 104. Alternatively, an end portion, and not a center portion, of the first pattern 116 may be removed as described above.

Figure 4B:
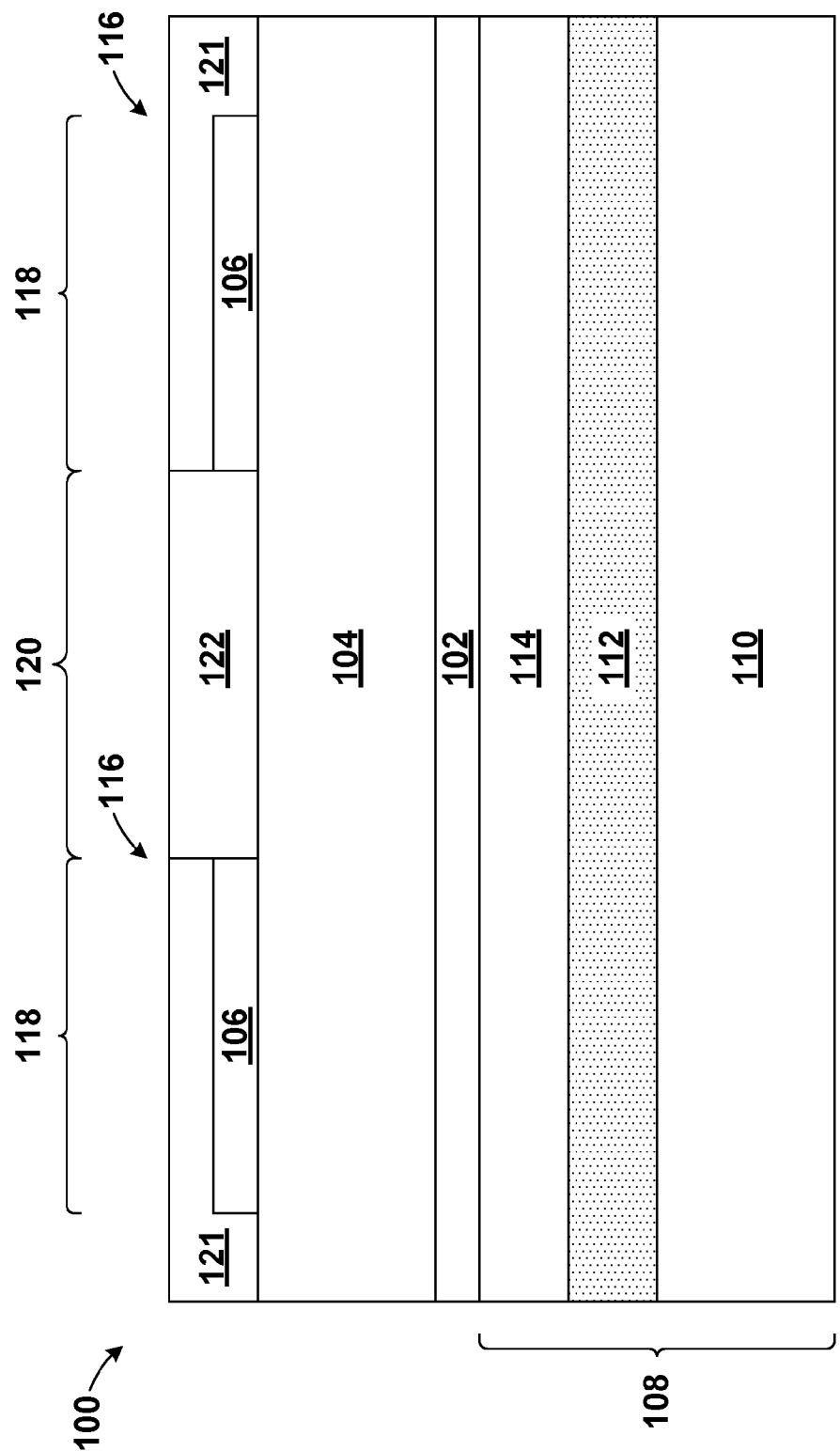
FIG. 4B is a cross section view of FIG. 4, taken along section line B-B.

Referring now to FIGS. 4 and 4A a demonstrative illustration of a structure during an intermediate step of the method of fabricating finFET devices with multiple channel lengths is shown according to one embodiment. More specifically, the method can include forming a fill material 122 in the second region 120. FIG. 4 illustrates a cross section view of the structure 100. FIG. 4A is a cross section view of FIG. 4 taken along section line A-A. FIG. 4 B is a cross section view of FIG. 4 taken along section line B-B.

The fill material 122 may be blanket deposited on top of the mandrel layer 104 in the second region 120 and above the photoresist 121 in the first regions 118. The fill material 122 may include any dielectric material suitable for use as a mask, and which may be patterned (etched) selective to both the mandrel layer 104 and the first hardmask layer 106. For example, if the first hardmask layer 106 is a nitride, the fill material 122 may preferably be an oxide. In an embodiment, the fill material 122 may include silicon oxide, which may be formed using conventional deposition methods, for example, chemical vapor deposition, atomic layer deposition, physical vapor deposition, sputtering, or other like deposition techniques. It should be noted that the fill material 122 may preferably be deposited at temperatures less than 200° C. so as not to damage the photoresist 121.

A chemical mechanical polishing technique may be used to remove excess fill material 122 from above the photoresist 121 such that an upper surface of the fill material 122 is substantially flush with an upper surface of the photoresist 121 in the first region 118. In an embodiment, the fill material 122 may preferably be deposited only within the second region 120. This may be accomplished, for example, by forming the fill material 122 before removing the photoresist 121 used to remove the portion of the first pattern 116.

Figure 5:
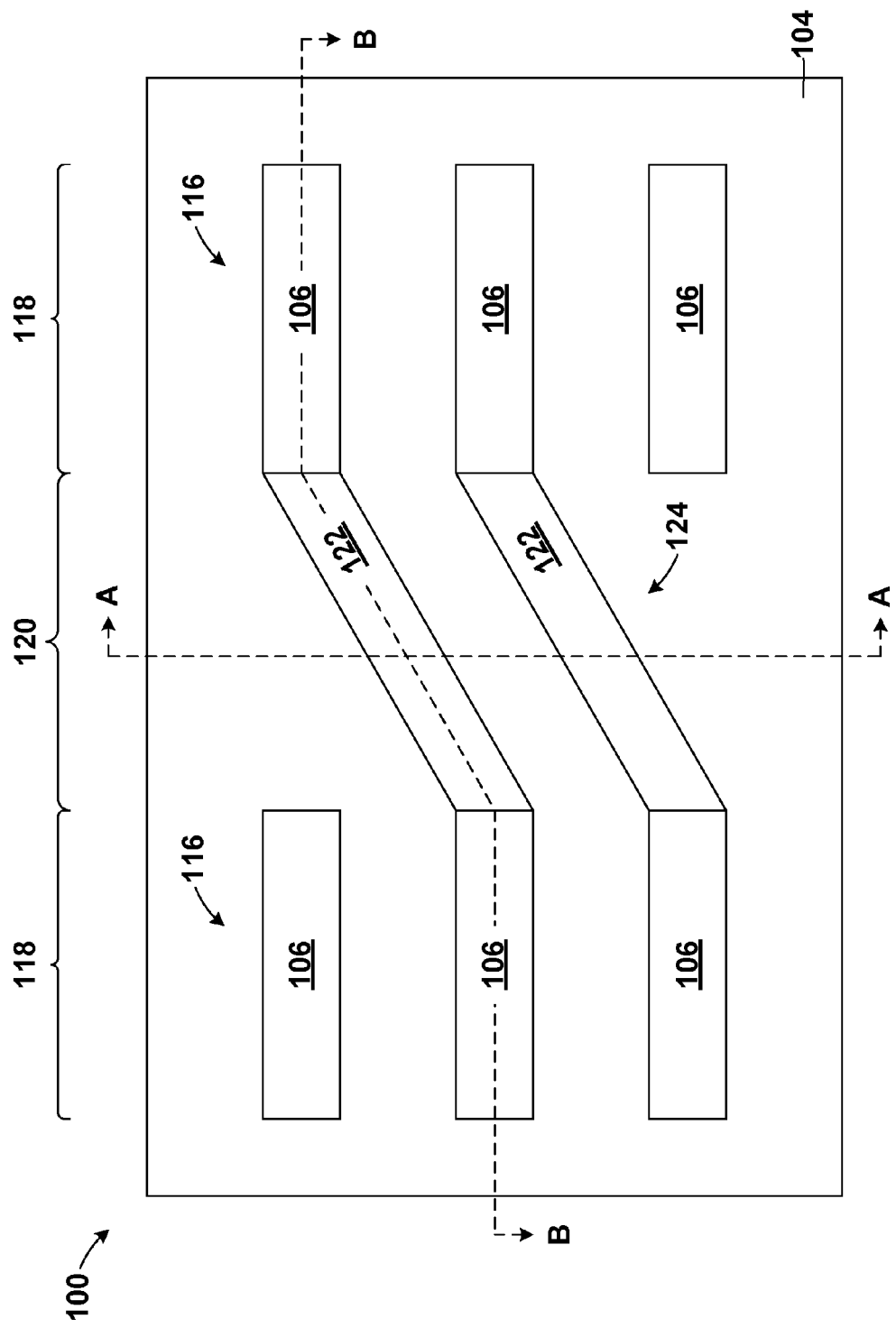
FIG. 5 is a top view of the structure and illustrates forming a second pattern in the fill material according to an exemplary embodiment.
Figure 5A:
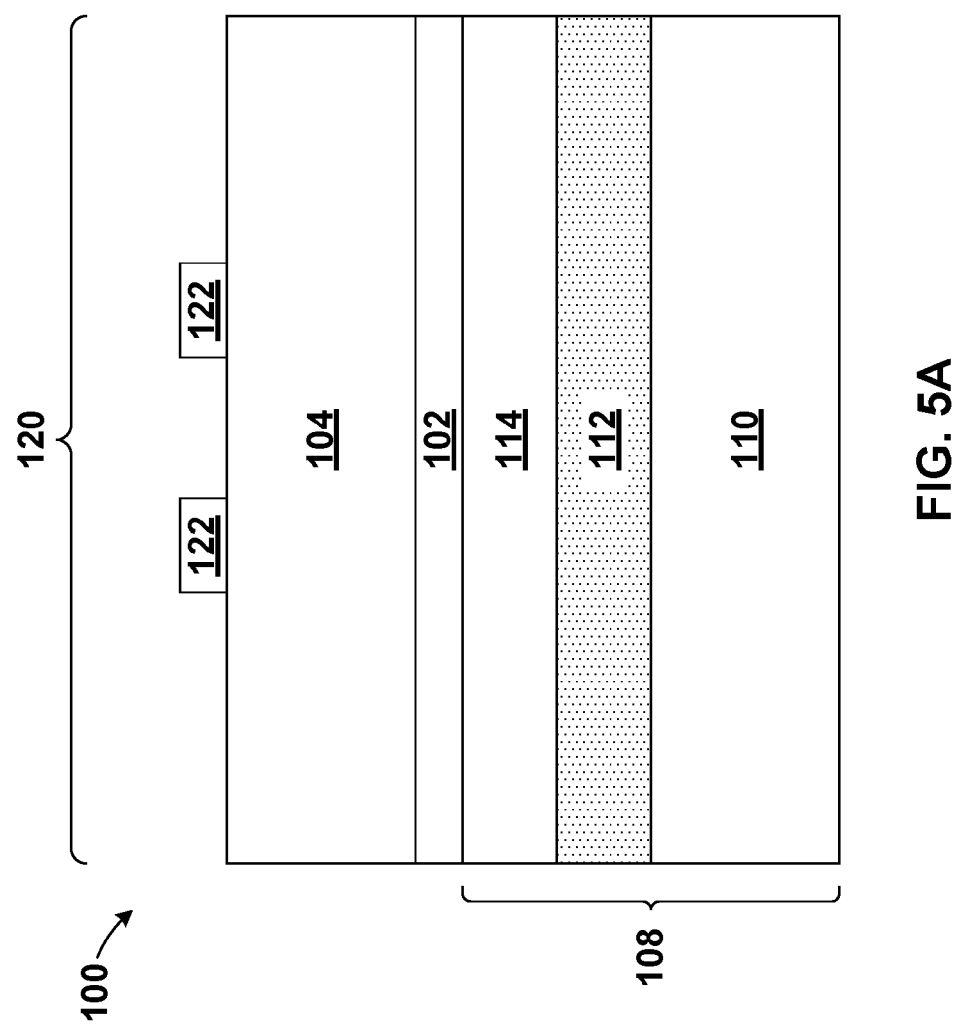
FIG. 5A is a cross section view of FIG. 5, taken along section line A-A.
Figure 5B:
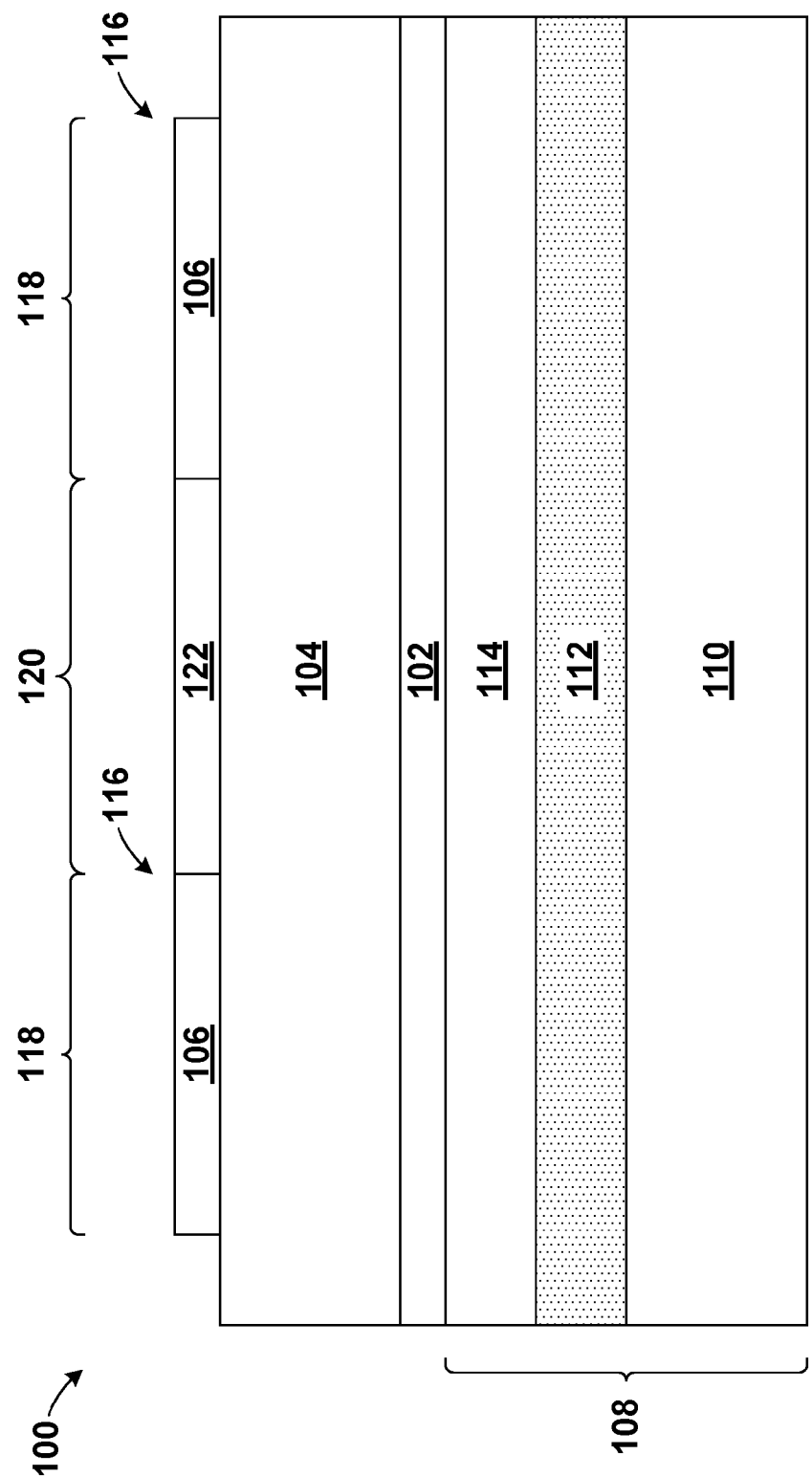
FIG. 5B is a cross section view of FIG. 5, taken along section line B-B.

Referring now to FIGS. 5 and 5A a demonstrative illustration of a structure during an intermediate step of the method of fabricating finFET devices with multiple channel lengths is shown according to one embodiment. More specifically, the method can include forming a second pattern 124 in the fill material 122. FIG. 5 illustrates a cross section view of the structure 100. FIG. 5A is a cross section view of FIG. 5 taken along section line A-A. FIG. 5B is a cross section view of FIG. 5 taken along section line B-B.

After depositing the fill material 122, it may be etched to form the second pattern 124 according to lithographic patterning and etching techniques known in the art. The second pattern 124 may include a set of parallel lines or "fins," etched from the fill material 122 selective to the mandrel layer 104. In an embodiment, as illustrated in the figures the second pattern 124 includes two parallel lines; however, it may include any number of parallel lines. Like the first pattern 116, the parallel lines of the second pattern 124 may be any width and have any spacing to produce the desired finFET array. The width and spacing of the parallel lines of the second pattern 124 may be similar to that of the parallel lines of the first pattern 116. In a preferred embodiment, the parallel lines of the second pattern 124 may be in direct contact with the parallel lines of the first pattern 116. More specifically, ends of the first pattern 116 are in direct contact with ends of the second pattern 124. In an embodiment, the spacing between the parallel lines of the first pattern 116 and the size of the second region 120 may dictate the length and angle of the parallel lines of the second pattern 124.

The parallel lines of the second pattern 124 are positioned at an angle relative to the parallel lines of the first pattern 116. The parallel lines of the second pattern 124 may be patterned at any angle relative to the parallel lines of the first pattern 116 subject to known fabrication limitations and current ground rules. It should be noted that the angle of the parallel lines of the second pattern 124 relative to the parallel lines of the first pattern 116 may dictate an effective channel length of one or more subsequently fabricated finFET devices in the finFET array. After patterning and removing excess fill material 122, the photoresist 121 may be removed from the first regions 118 according to known techniques.

A chemical mechanical polishing technique may be used to recess the second pattern 124 in the fill material 122 such that an upper surface of the second pattern 124 in the fill material 122 is substantially flush with an upper surface of the first pattern 116 in the first hardmask layer 106.

Figure 6:
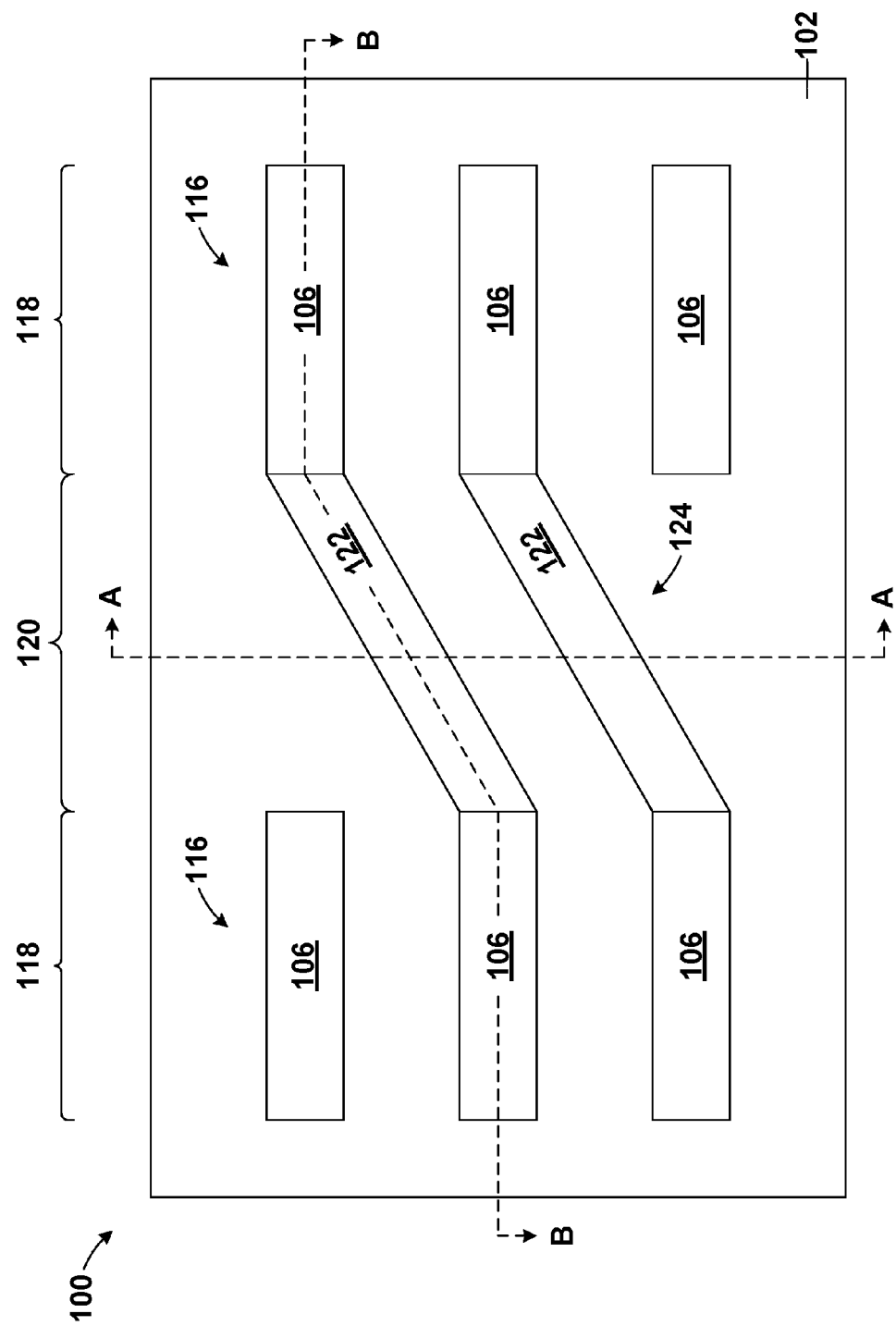
FIG. 6 is a top view of the structure and illustrates forming a mandrel by transferring the first and second patterns into a mandrel layer according to an exemplary embodiment.
Figure 6A:
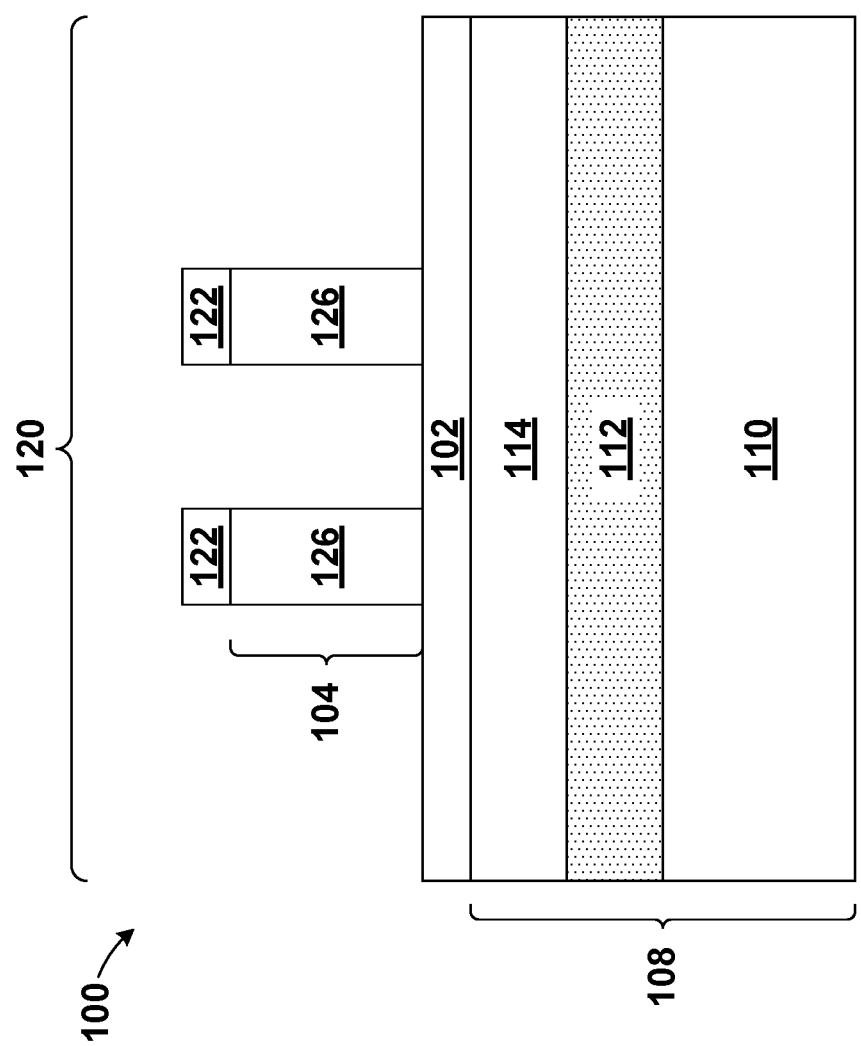
FIG. 6A is a cross section view of FIG. 6, taken along section line A-A.
Figure 6B:
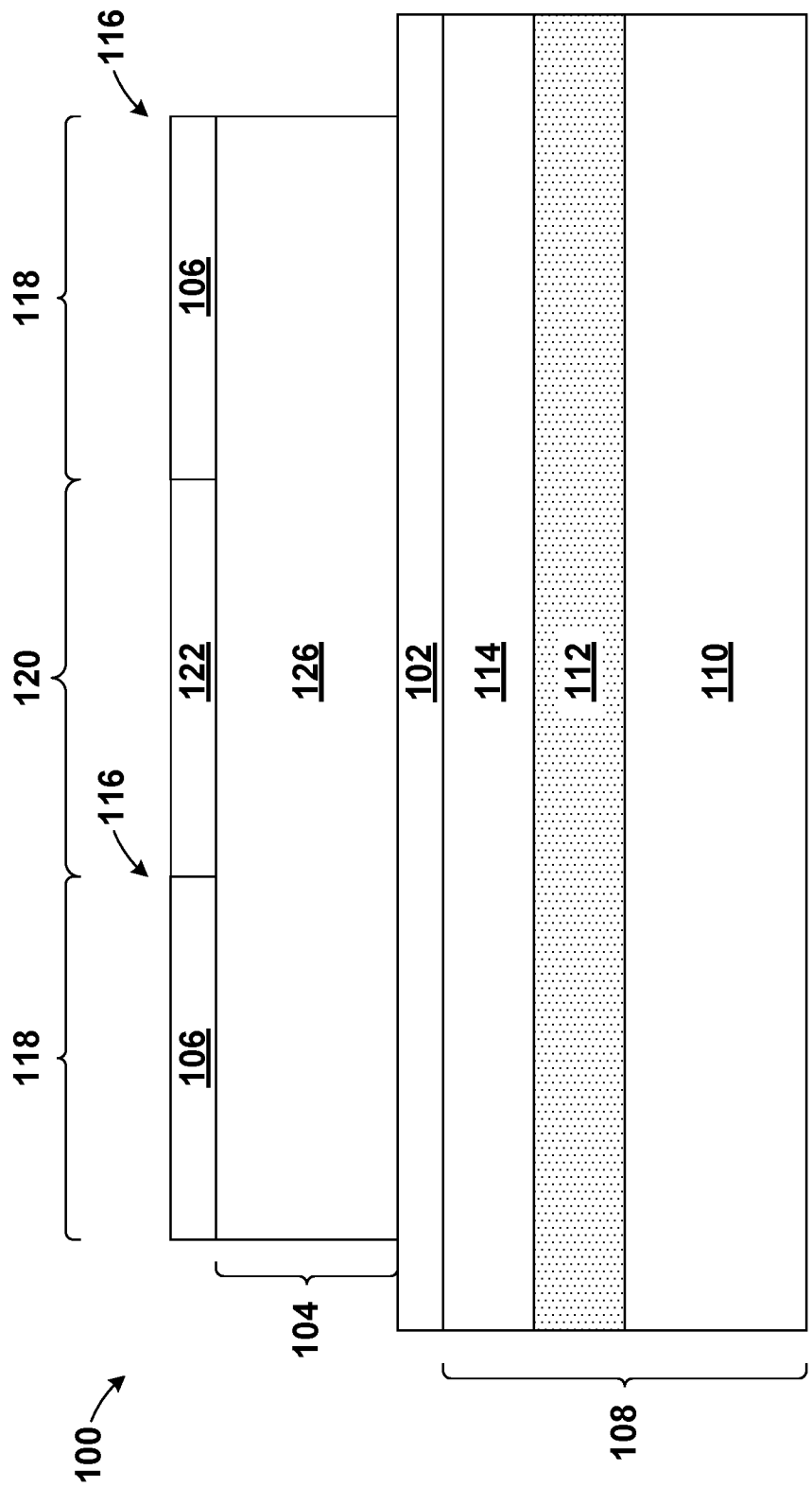
FIG. 6B is a cross section view of FIG. 6, taken along section line B-B.

Referring now to FIGS. 6 and 6A a demonstrative illustration of a structure during an intermediate step of the method of fabricating finFET devices with multiple channel lengths is shown according to one embodiment. More specifically, the method can include transferring the first pattern 116 and the second pattern 124 into the mandrel layer 104 to form mandrels 126. FIG. 6 illustrates a cross section view of the structure 100. FIG. 6A is a cross section view of FIG. 6 taken along section line A-A. FIG. 6B is a cross section view of FIG. 6 taken along section line B-B.

The mandrel layer 104 is then lithographically patterned to create the mandrels 126. The mandrels 126 can be formed by applying known patterning techniques involving exposing a photo-resist and transferring the exposed pattern of the photo-resist by etching the mandrel layer 104. More specifically, the first pattern 116 defined by the first hardmask layer 106 and the second pattern 124 defined by the fill material 122 may be transferred into the mandrel layer 104 to form the mandrels 126. In an embodiment, where the first hardmask layer 106 is a nitride and the fill material is an oxide, a reactive-ion-etching technique using a fluorocarbon or chlorine, or bromine based etchant with additional gases such as O2 or Ar may be used. The second hardmask layer 102 may function as an etch stop during patterning of the mandrel layer 104.

Figure 7:
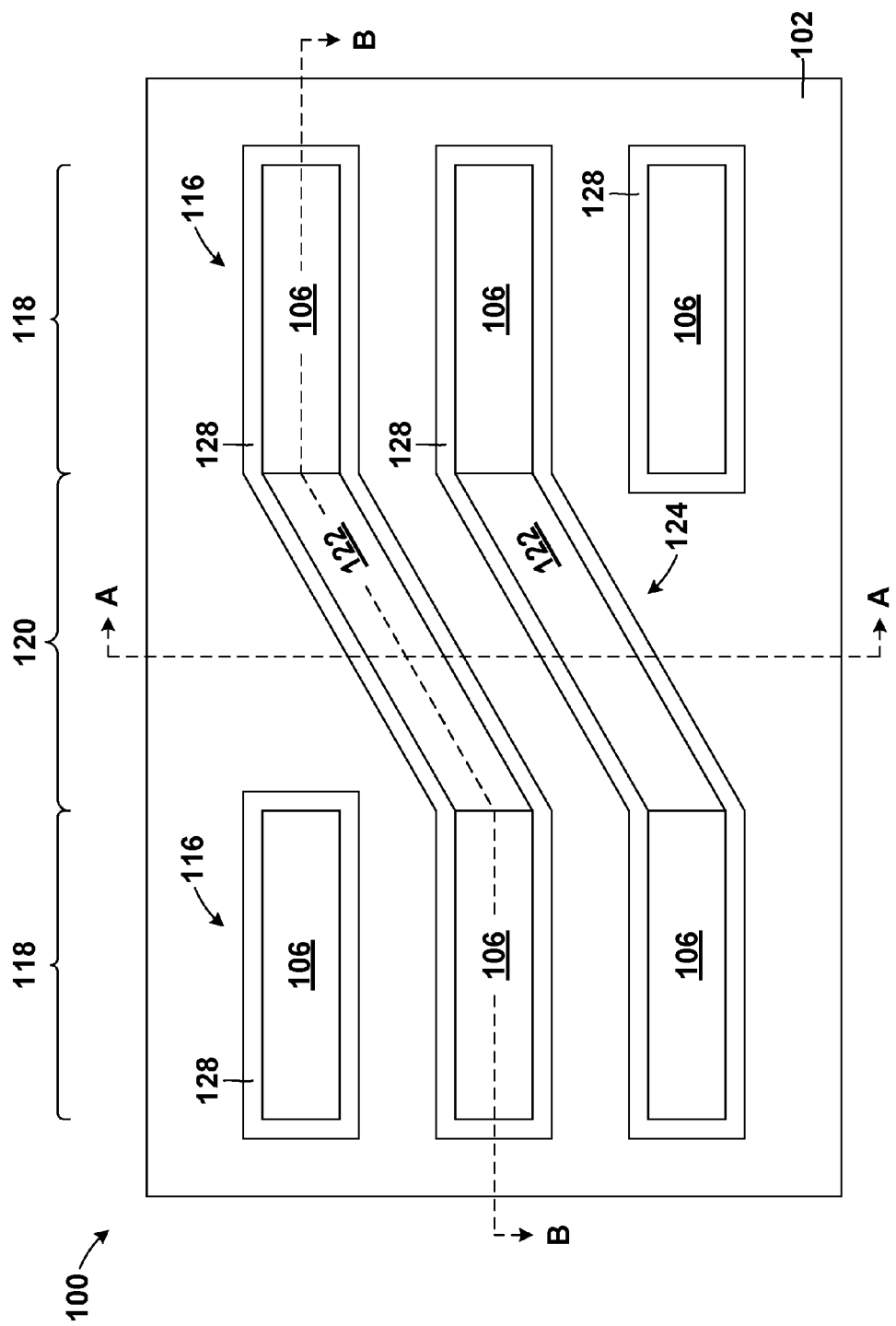
FIG. 7 is a top view of the structure and illustrates forming sidewall spacers on opposite sidewalls of the mandrel according to an exemplary embodiment.
Figure 7A:
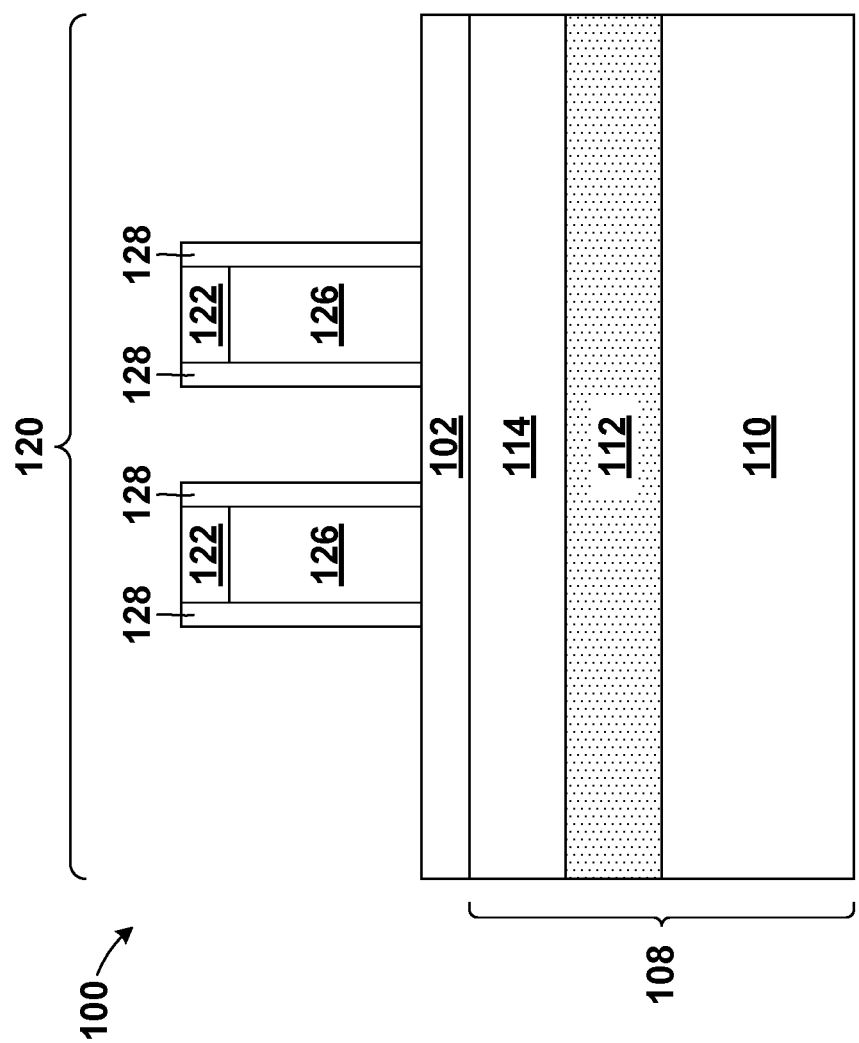
FIG. 7A is a cross section view of FIG. 7, taken along section line A-A.
Figure 7B:
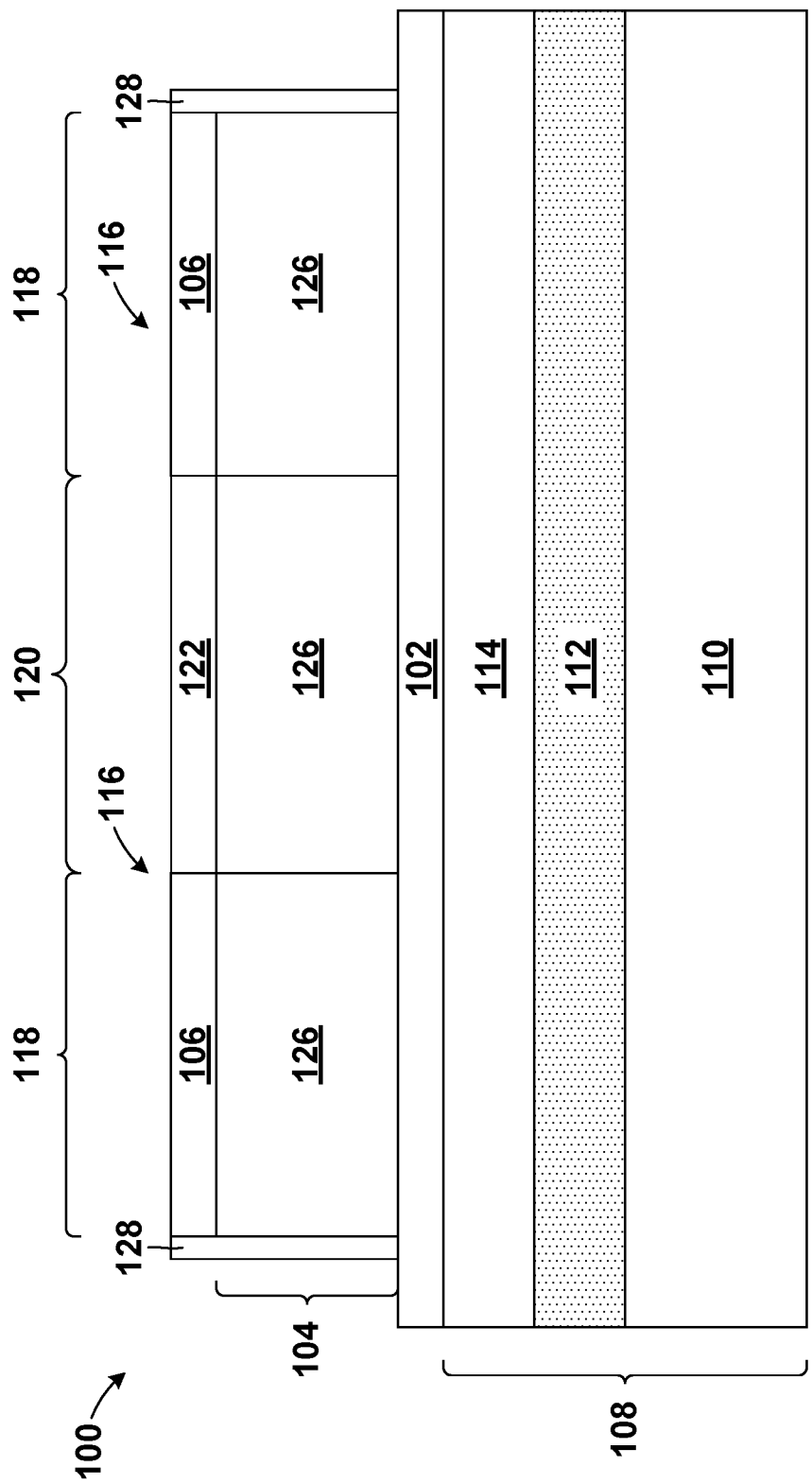
FIG. 7B is a cross section view of FIG. 7, taken along section line B-B.

Referring now to FIGS. 7 and 7A a demonstrative illustration of a structure during an intermediate step of the method of fabricating finFET devices with multiple channel lengths is shown according to one embodiment. More specifically, the method can include forming sidewall spacers 128 on opposite sidewalls of the mandrels 126. FIG. 7 illustrates a cross section view of the structure 100. FIG. 7A is a cross section view of FIG. 7 taken along section line A-A. FIG. 7B is a cross section view of FIG. 7 taken along section line B-B.

First, a layer of dielectric material may be conformally deposited on top of the structure 100. Specifically, the layer of dielectric material may be deposited directly on the first hardmask layer 102 and covering the mandrels 126. It should be noted that the second hardmask 106 and the fill layer 122 may or may not be present during deposition of the dielectric material and subsequent formation of the sidewall spacers 128. In an embodiment, the layer of dielectric material can include, for example, silicon nitride or silicon oxide. It may be preferable, in some cases, to fabricate the sidewall spacers 128 from a material having a substantially different etch rate than that of the second hardmask layer 102 to effect good etch selectivity during subsequent patterning steps. In an embodiment, the layer of dielectric material may preferably include an oxide, for example, silicon oxide. The layer of dielectric material can be deposited with a conformal deposition technique, using any known atomic layer deposition technique, molecular layer deposition techniques, or other known conformal deposition techniques. In an embodiment, the layer of dielectric material can have a substantially conformal and uniform thickness ranging from about 5 nm to about 20 nm, and ranges there between.

Next, a directional anisotropic etching technique may be used to remove a portion of the layer of dielectric material from horizontal surfaces of the structure 100, while leaving it on the sidewalls of the mandrels 126. For example, a reactive-ion-etching technique may be used to remove portions of the layer of dielectric material from directly above the second hardmask layer 102 and from a top surface of the second hardmask layer and the fill material 122, or alternatively, from a top surface of the mandrels 126. The portion of the layer of dielectric material remaining along opposite sidewalls of the mandrels 126, form the sidewall spacers 128. Furthermore, the mandrels 126 and the sidewall spacers 128 should each include materials that would allow the mandrel 126 to be subsequently removed selective to the sidewall spacers 128. Here, it should also be noted that the sidewall spacers 128 depicted in the figures are for illustration purposes and generally can have a slightly different shape from those shown. For example, the sidewall spacers 128 can have rounded corners which may naturally form during the directional etching process as is known in the art.

The sidewall spacers 128 may have a lateral width ranging substantially equal to the conformal thickness of the layer of dielectric material above. In an embodiment, the lateral width of the sidewall spacers 128 may preferably be sublithographic as previously described above. In an embodiment, for example, the sidewall spacers 128 may have a lateral width ranging from about 5 nm to about 15 nm, and ranges there between. It is possible to adjust spacer width based on etch bias or loss of material during process to meet final technology target dimension. The sidewall spacers 128 define a fin pattern which may subsequently be transferred into underlying layers, including the second hardmask layer 102 and the top semiconductor layer 114.

Figure 8:
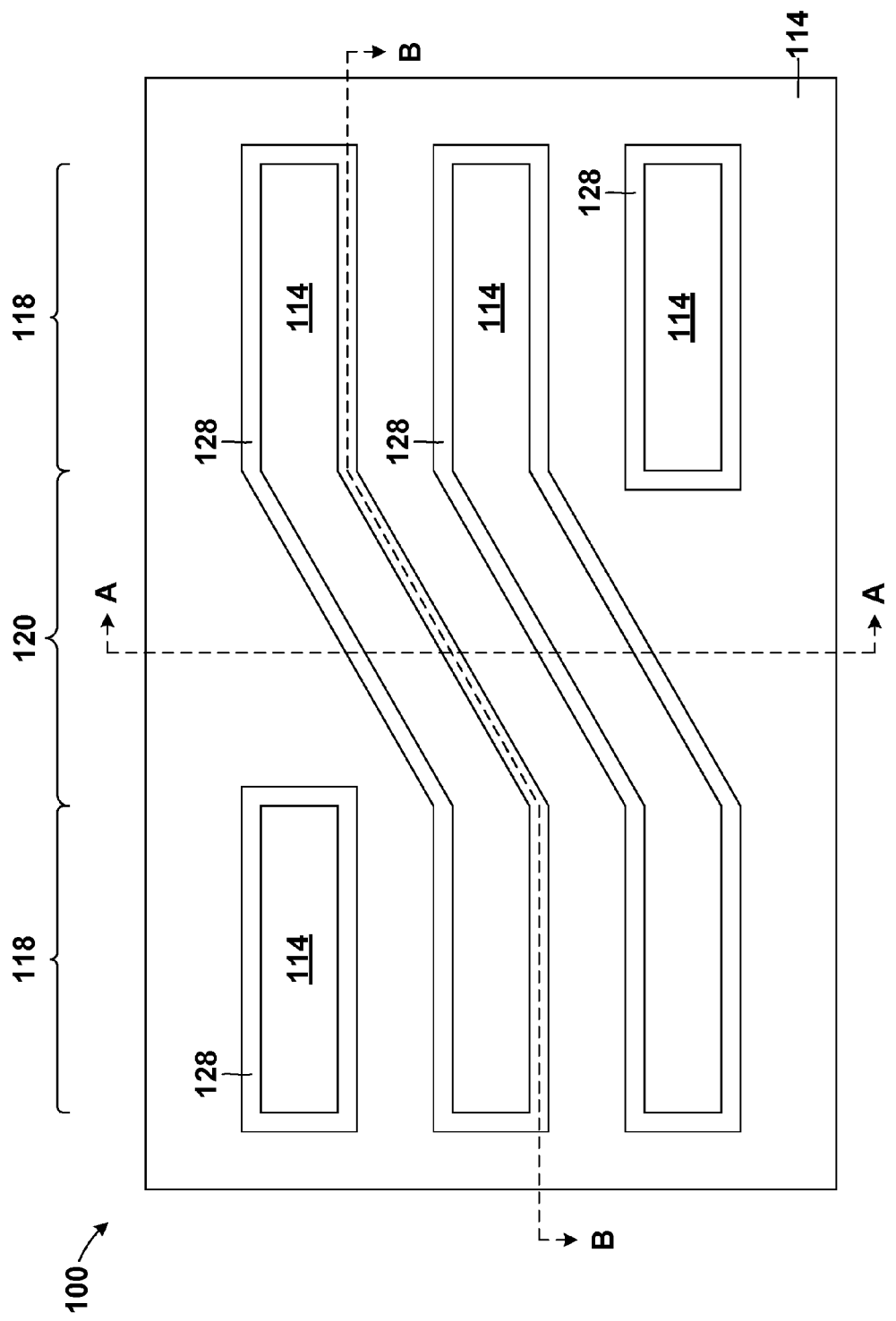
FIG. 8 is a top view of the structure and illustrates removing the mandrel selective to the sidewall spacers and transferring a fin pattern into the second hardmask layer according to an exemplary embodiment.

Referring now to FIGS. 8 and 8A a demonstrative illustration of a structure during an intermediate step of the method of fabricating finFET devices with multiple channel lengths is shown according to one embodiment. More specifically, the method can include removing the mandrels 126 selective to the sidewall spacers 128 and transferring the fin pattern into the second hardmask layer 102. FIG. 8 illustrates a cross section view of the structure 100. FIG. 8A is a cross section view of FIG. 8 taken along section line A-A. FIG. 8B is a cross section view of FIG. 8 taken along section line B-B.

First, a non-selective breakthrough etch may be applied to exposed the mandrel 126, if necessary to remove some of all of the first hardmask 106 and/or the fill material 122. In an embodiment, the mandrel 126 is silicon, and the sidewall spacers 128 are an oxide. In such cases, the silicon may be removed selective to the oxide. Furthermore, the mandrel 126 be removed selective to the second hardmask layer 102. In an embodiment, the mandrel 126 can be removed using a typical dry etching including HBr in which the sidewall spacers 130 won't be trimmed or minimal loss.

Next, the second hardmask layer 102 may be etched to expose the top semiconductor layer 114. In doing so, the sidewall spacers 128 may simultaneously be lowered. A directional anisotropic etching technique such as a reactive-ion-etching technique can be used to etch the second hardmask layer 102. In an embodiment, where the second hardmask layer 102 is silicon nitride a reactive-ion-etching technique using a fluorocarbon based etchant with additional gases such as O2 or Ar may be used. In the present step, the sidewall spacers 128 can function as a mask, and can have high etch selectivity relative to the second hardmask layer 102.

Figure 9:
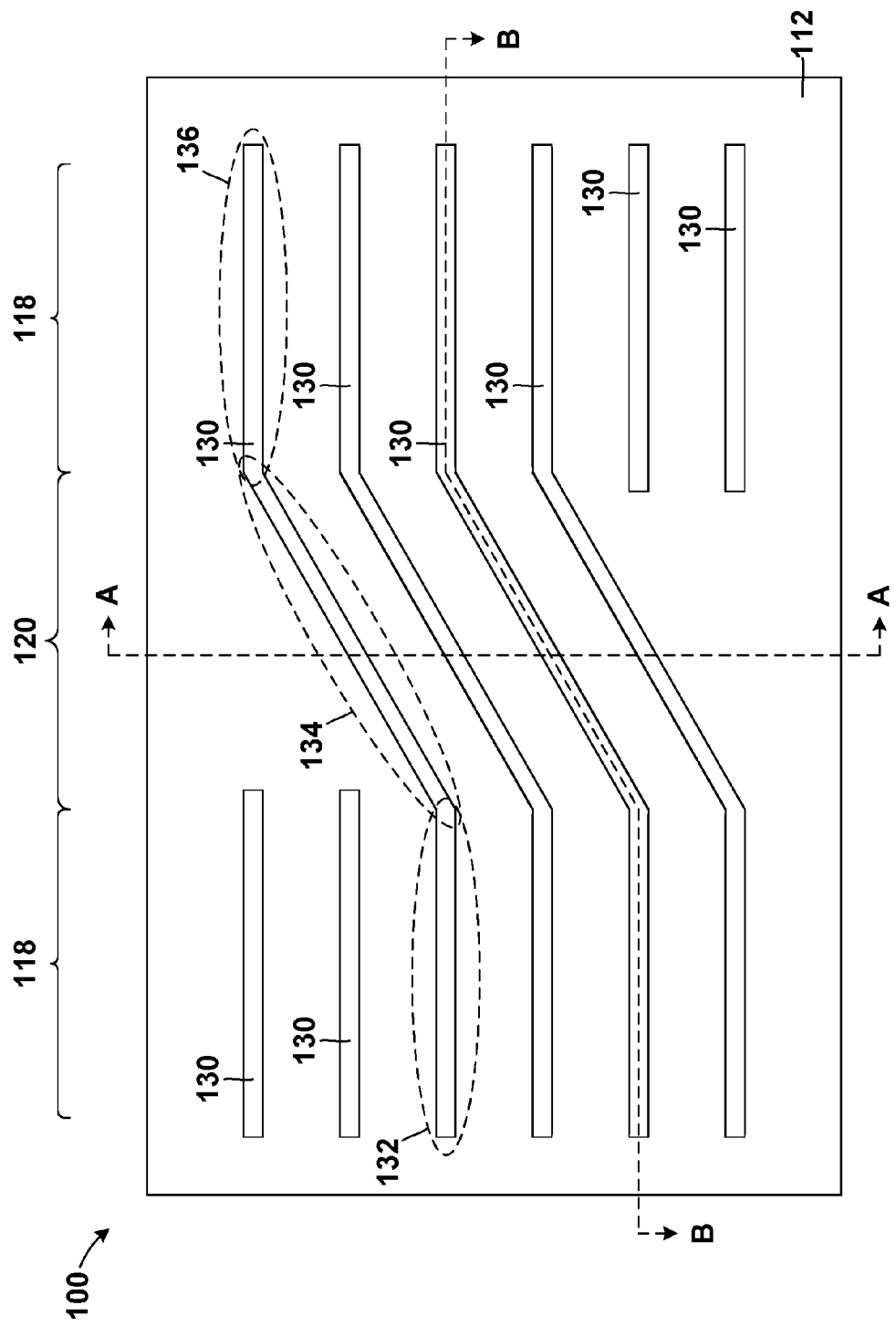
FIG. 9 is a top view of the structure and illustrates removing the set of sidewall spacers, and transferring the fin pattern from the second hardmask layer into the top semiconductor layer of the substrate according to an exemplary embodiment.
Figure 9A:
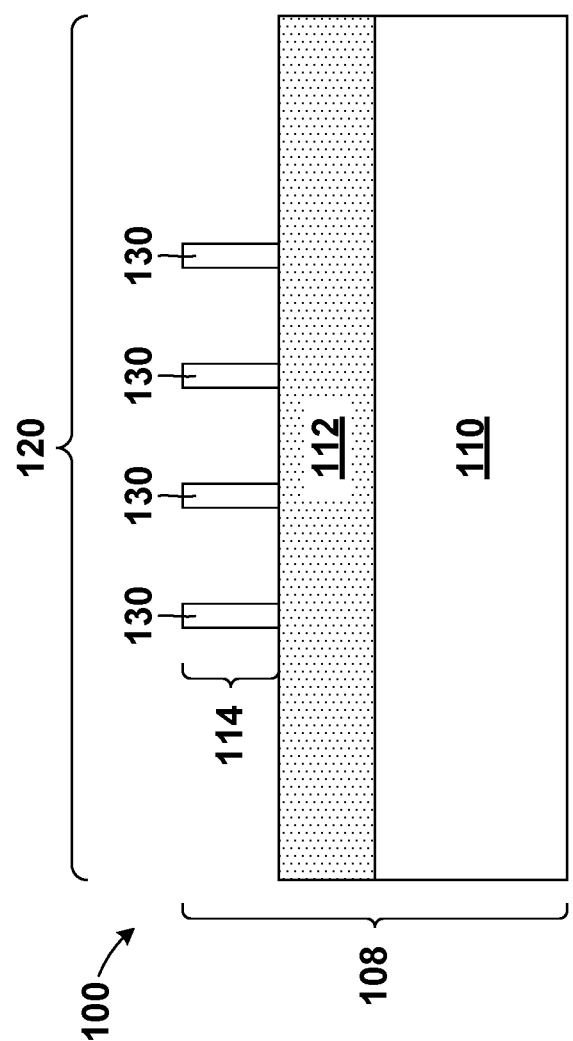
FIG. 9A is a cross section view of FIG. 9, taken along section line A-A.

Referring now to FIGS. 9 and 9A a demonstrative illustration of a structure during an intermediate step of the method of fabricating finFET devices with multiple channel lengths is shown according to one embodiment. More specifically, the method can include removing the sidewall spacers 128, and transferring the fin pattern from the second hardmask layer 102 into the top semiconductor layer 114 of the substrate 108. Transfer of the fin pattern into a portion of the top semiconductor layer 114 creates fins 130 for the finFET array. FIG. 9 illustrates a cross section view of the structure 100. FIG. 9A is a cross section view of FIG. 9 taken along section line A-A. FIG. 9B is a cross section view of FIG. 9 taken along section line B-B.

The sidewall spacers 128 may be removed selective to the second hardmask layer 102 and the top semiconductor layer 114 according to known techniques. In an embodiment, doing so will require etching oxides of the sidewall spacers 128 selective to nitrides of the second hardmask layer 102.

Next, the fin pattern may be transferred from the second hardmask layer 102 into the top semiconductor layer 114. In doing so, the top semiconductor layer 114 may preferably be etched selective to the second hardmask layer 102 according to known techniques. The top semiconductor layer 114 may be etched to a desired depth to form the fins 130. The desired depth can depend on the ultimate function of the final finFET array. In an embodiment, the top semiconductor layer 114 may be etched to a depth sufficient to expose the buried insulator layer 112, as illustrated.

A directional etching technique such as a reactive-ion-etching technique can be used to etch the top semiconductor layer 114 and form the fins 130. In an embodiment, the top semiconductor layer 114 can be etched with a reactive-ion-etching technique using a chlorine or a bromine based etchant. In the present step, the second hardmask 102 functions as a mask, and can have high etch resistance to the particular etching technique(s) applied to etch the top semiconductor layer 114. Finally, the second hardmask layer 102 can be removed in subsequent steps using any suitable removal technique known in the art.

It should be noted that the lateral thickness or width of the sidewall spacers 128 is dependent on the deposited thickness of the layer of dielectric material. Furthermore, the lateral thickness or width of the sidewall spacers 128 is directly related to a width of the fins 130. Therefore, the deposited thickness of the layer of dielectric material is directly related to a width of the fins 130.

The fins 130 may include one or more continuous fins having multiple segments in which at least one of the segments is presented at an angle relative to the other segments. In the present embodiment, one or more of the fins 130 may include three segments (132, 134, 136) in which the first segment 132 and third segment 136 may be fabricated in the first region 118 of the structure 100 and the second segment 134 may be fabricated in the second region 120 of the structure 100. Also, as illustrated in the present embodiment, the first segment 132 may be fabricated substantially parallel to the third segment 136, and the second segment 134 may be fabricated at an angle relative to the first and third segments 132, 136. In an embodiment, an angle between the first segment of the continuous fin and the second segment of the continuous fin is greater than 90 degrees. In general, the second segment 134 may be in direct contact with both to the first and third segments 132, 136, and therefore form a continuous fin structures having electrical continuity throughout.

In an alternative embodiment, one or more of the fins 130 may include only two segments (e.g. 132, 134) in which the first segment 132 may be fabricated in the first region 118 of the structure 100 and the second segment 134 may be fabricated in the second region 120 of the structure 100. Further, the second segment 134 may be fabricated at an angle relative to the first segment 132.

It should be noted that various different approaches and processing techniques know in the art may be used to trim the fins 130 and define the final finFET array. For example, a cut mask (not shown) may be used to trim the ends of the fins 130. For purposes of the present description, the fins 130 are illustrated in FIGS. 9, 9A and 9B after the fins 130 have been trimmed.

Figure 10:
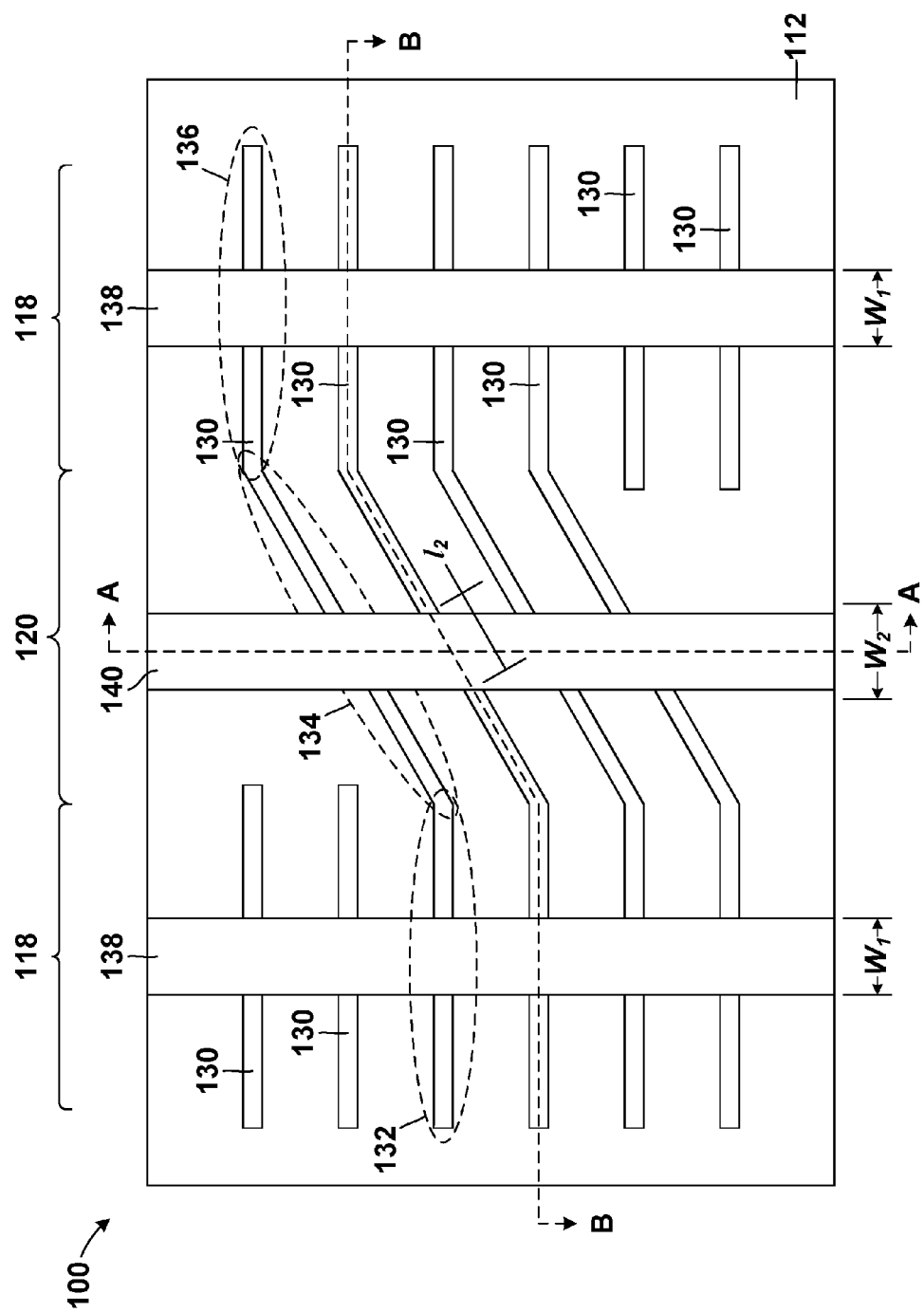
FIG. 10 is a top view of the structure and illustrates forming one or more gate electrodes above and between fins formed in the substrate according to an exemplary embodiment.
Figure 10A:
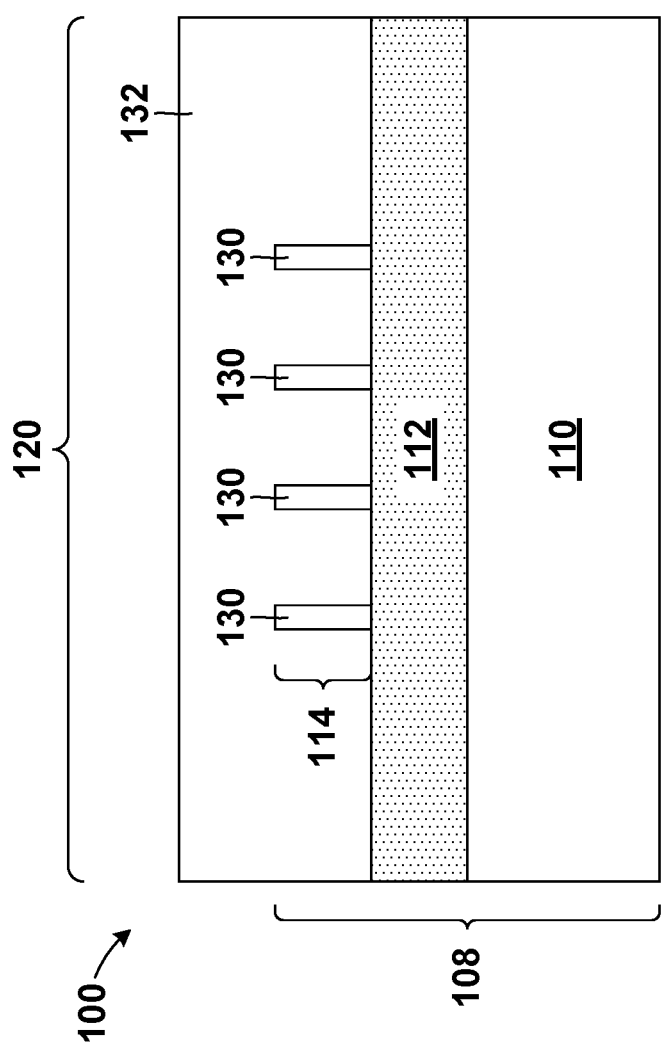
FIG. 10A is a cross section view of FIG. 10, taken along section line A-A.
Figure 10B:
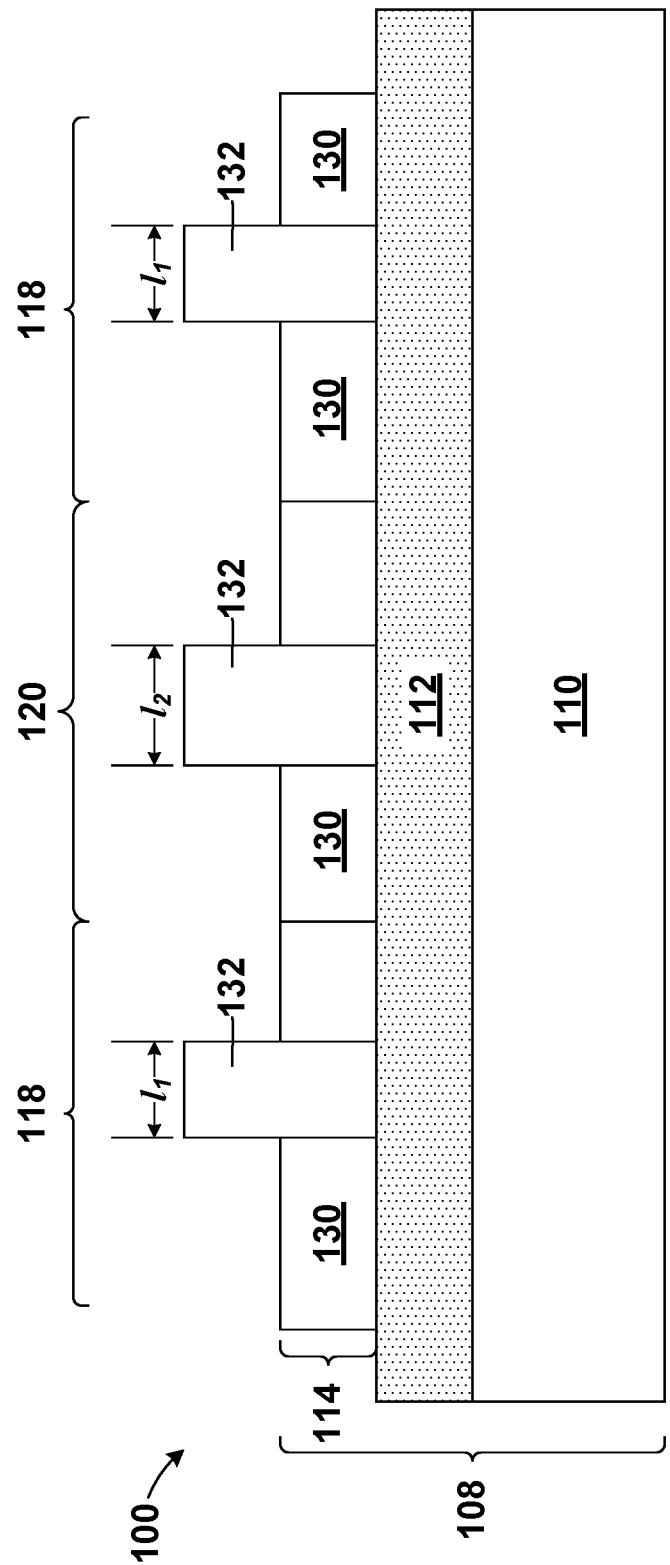
FIG. 10B is a cross section view of FIG. 10, taken along section line B-B.

Referring now to FIGS. 10 and 10A a demonstrative illustration of a structure during an intermediate step of the method of fabricating finFET devices with multiple channel lengths is shown according to one embodiment. More specifically, the method can include forming one or more gate electrodes 138. 140 above and between the fins 130. FIG. 10 illustrates a cross section view of the structure 100. FIG. 10A is a cross section view of FIG. 10 taken along section line A-A. FIG. 10B is a cross section view of FIG. 10 taken along section line B-B.

A typical replacement gate or gate last fabrication technique, or a gate first fabrication technique well known in the art may be used to form the gate electrodes 138 and complete the formation of the structure 100. In an embodiment, a gate oxide (not shown) may be deposited prior to forming the gate electrodes 138, 140. The gate oxide may include any of the high-k dielectric materials known in the art, for example $HfO_2$, and deposited with methods such as atomic layer deposition (ALD), chemical vapor deposition (CVD), or physical vapor deposition (PVD). The gate electrodes 138, 140 may include one or more work function metals such as TiN, TaN, or TiC, to achieve the desired device threshold voltage and one or more low resistance metal such as W, Al, or Co. The gate electrodes 138, 140 may be formed directly on top of the buried insulator layer 112 and substantially surround at least three sides of the fins 130, as illustrated. In an embodiment, all gate electrode 138 may preferably be formed parallel to one another.

As illustrated in the figures three parallel gate electrodes 138 may be formed across eight different fins 130. More specifically, a first gate electrode 138 may be formed in the first region 118 and a second gate electrode 140 may be formed in the second region 120. The first gate electrode 138 in the first region 118 crosses six different fins 130, four of which are continuous multi-segment fins and two are straight fins. The second gate electrode 140 in the second region 120 crosses only four continuous multi-segment fins 130. The structure 100 is illustrated with a discrete number of fins 130 and gate electrodes 138; however, it may include any number of fins 130 and gate electrodes 138 in any number of configurations, as desired by design.

More specifically, in an embodiment, the first gate electrode 138 may cross the first segments 132 of the continuous multi-segment fins 130 and the second gate electrode 140, parallel to the first gate electrode 138, may cross the second segments 132 of the continuous multi-segment fins 130. In an embodiment, the first gate electrode 138 may cross the first segments 132 of the continuous multi-segment fins 130 at a first angle and second gate electrode 140 may cross the second segments 134 of the continuous multi-segment fins 130 at a second angle, in which the first angle is different from the second angle. In an embodiment, the first gate electrode 138 may be substantially perpendicular to the first segments 132 of the continuous multi-segment fins 130, and the second gate electrode 140 is parallel to the first gate electrode 138 and may not be perpendicular to the second segments 134 of the continuous multi-segment fins 130. In an embodiment, the structure 100 may include only a single continuous multi-segment fin 130 with two parallel gate electrodes 132 formed across different segments, where one segment is at an angle relative to the other.

With specific reference to FIG. 10B, the first gate electrode 138 in the first region 118 may have an effective gate length ($l_1$) and the second gate electrode 140 in the second region 120 may have an effective gate length ($l_2$). It should be noted that effective gate length is synonymous to gate width or effective gate width for purposes of this discussion. In all cases, the effective gate length as illustrated in the figures is measured in a direction parallel to the length of the fin, or segment of the fin, between opposite sides of the gate electrodes. The effective gate length ($l_2$) of the second gate electrode 140 may be larger than the effective gate length ($l_1$) of the first gate electrode 138 because of the angle of the gate electrode relative to the segment of the fin. Stated differently, because the second segments 134 of the continuous multi-segment fins 130 are angled with respect to the second gate electrode 140, the effective gate length ($l_2$) is longer than it would otherwise be if they were perpendicular.

In an embodiment, the first and second gate electrodes 138, 140 may be fabricated with a width ($W_1$, $W_2$) ranging from about 10 nm to about 20 nm and a pitch of about 40 nm. The fins 130 may be fabricated with a width ranging from about 5 nm to about 15 nm and a pitch of about 30 nm. As such, the effective gate length ($l_1$) of the first gate electrode 138 may be about 10 nm to about 20 nm, the same as its nominal width, and the effective gate length ($l_2$) of the second gate electrode 140 may range from about 15 nm to about 30 nm, or larger than a nominal width of the gate electrode itself.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A method comprising:
  patterning a continuous fin having a first segment and a second segment in a semiconductor layer, the first segment is arranged at an oblique angle relative to the second segment, and the continuous fin comprises a substantially uniform width along its entire length, wherein a common vertical plane bisects the first segment of the continuous fin and a third segment of one of a plurality of continuous fins; and
  forming a first gate and a second gate substantially parallel to each other, the first gate substantially covering sides and a top of a portion of the first segment of the continuous fin, the second gate substantially covering sides and a top of a portion of the second segment of the continuous fin, wherein the common vertical plane is perpendicular to the first gate and the second gate.

2. The method of claim 1, wherein the continuous fin further comprises a third segment and a third gate substantially covering sides and a top of a portion of the third segment, the third segment is parallel to the first segment and arranged at the oblique angle relative to the second segment, the third gate is substantially parallel to both the first gate and the second gate, and the second segment is parallel to another segment of an adjacent continuous fin.

3. The method of claim 1, wherein the first gate is substantially perpendicular to the first segment of the continuous fin.

4. The method of claim 1, wherein the angle between the first segment and the second segment is greater than 90 degrees.

5. The method of claim 1, wherein a width of the continuous fin is sublithographic in dimension.

6. The method of claim 1, wherein a length of the portion of the second segment covered by the second gate is greater than a length of the portion of the first segment covered by the first gate, the lengths being measured between opposite sides of the first and second gates.

7. The method of claim 1, further comprising:
forming an array of transistors from the continuous fin and the first and second gates.

8. A method comprising:
patterning a continuous fin having a first segment and a second segment in a semiconductor layer, the first segment is arranged at an oblique angle relative to the second segment, the first segment and the second segment have a common width along their entire length, and sidewalls of the first segment are coplanar with sidewalls of another segment of an adjacent fin, wherein a common vertical plane bisects the first segment of the continuous fin and a third segment of one of a plurality of continuous fins; and
forming a first gate and a second gate substantially parallel to each other, the first gate substantially covering sides and a top of a portion of the first segment of the continuous fin, the second gate substantially covering sides and a top of a portion of the second segment of the continuous fin, wherein the common vertical plane is perpendicular to the first gate and the second gate.

9. The method of claim 8, wherein the continuous fin further comprises a third segment and a third gate substantially covering sides and a top of a portion of the third segment, the third segment is parallel to the first segment, arranged at the oblique angle relative to the second segment, and extends from an end of the second segment, and the third gate is substantially parallel to both the first gate and the second gate.

10. The method of claim 8, wherein the first gate is substantially perpendicular to the first segment of the continuous fin.

11. The method of claim 8, wherein a width of the continuous fin is sublithographic in dimension.

12. The method of claim 8, wherein a length of the portion of the second segment covered by the second gate is greater than a length of the portion of the first segment covered by the first gate, the lengths being measured between opposite sides of the first and second gates.

13. The method of claim 8, further comprising:
forming an array of transistors from the continuous fin and the first and second gates.

14. A method comprising:
patterning a continuous semiconductor fin having a first segment, a second segment, and a third segment, the second segment extends from an end of the first segment to an end of the third segment, the first segment is arranged at an oblique angle relative to the second segment, the third segment is parallel to the first segment and arranged at the oblique angle relative to the second segment, and the first segment, the second segment, and the third segment have a common width along their entire length, wherein a common vertical plane bisects the first segment of the continuous semiconductor fin and a third segment of one of a plurality of continuous semiconductor fins; and
forming a first gate, a second gate, and a third gate substantially parallel to each other, the first gate substantially covering sides and a top of a portion of the first segment of the continuous semiconductor fin, the second gate substantially covering sides and a top of a portion of the second segment of the continuous semiconductor fin; and the third gate substantially covering sides and a top of a portion of the third segment of the continuous semiconductor fin, wherein the common vertical plane is perpendicular to the first gate, the second gate, and a third gate.

15. The method of claim 14, wherein the first gate is substantially perpendicular to the first segment of the continuous semiconductor fin.

16. The method of claim 14, wherein the angle between the first segment and the second segment is greater than 90 degrees.

17. The method of claim 14, wherein a width of the continuous semiconductor fin is sublithographic in dimension.

18. The method of claim 14, wherein a length of the portion of the second segment covered by the second gate is greater than a length of the portion of the first segment covered by the first gate, the lengths being measured between opposite sides of the first and second gates.

19. The method of claim 14, further comprising:
forming an array of transistors from the continuous semiconductor fin and the first and second gates.

* * * * *